US009358924B1

(12) United States Patent
Preston et al.

(10) Patent No.: US 9,358,924 B1
(45) Date of Patent: Jun. 7, 2016

(54) SYSTEM AND METHOD FOR MODELING ADVANCED AUTOMOTIVE SAFETY SYSTEMS

(75) Inventors: Dan Alan Preston, Bainbridge Island, WA (US); Joseph David Preston, Bainbridge Island, WA (US); Kenneth Schofield, Holland, MI (US); Thomas August Manos, Bainbridge Island, WA (US)

(73) Assignee: EAGLE HARBOR HOLDINGS, LLC, Bainbridge Island, WA (US)

( * ) Notice: Subject to any disclaimer, the term of this patent is extended or adjusted under 35 U.S.C. 154(b) by 527 days.

(21) Appl. No.: 12/776,137

(22) Filed: May 7, 2010

Related U.S. Application Data

(60) Provisional application No. 61/176,681, filed on May 8, 2009, provisional application No. 61/177,015, filed on May 11, 2009.

(51) Int. Cl.
*G01S 7/41* (2006.01)
*G01S 13/93* (2006.01)
*B60Q 9/00* (2006.01)

(52) U.S. Cl.
CPC ........................................ *B60Q 9/00* (2013.01)

(58) Field of Classification Search
None
See application file for complete search history.

(56) References Cited

U.S. PATENT DOCUMENTS

| 2,995,318 | A | 8/1961 | Cocharo |
| 3,812,468 | A | 5/1974 | Wollum et al. |
| 4,303,978 | A | 12/1981 | Shaw |
| 4,528,563 | A | 7/1985 | Takeuchi |
| 4,558,460 | A | 12/1985 | Tanaka |
| 4,591,976 | A | 5/1986 | Webber |
| 4,735,274 | A | 4/1988 | Good et al. |

(Continued)

FOREIGN PATENT DOCUMENTS

| DE | 3125161 A1 | 1/1983 |
| DE | 4237987 | 5/1994 |

(Continued)

OTHER PUBLICATIONS

Spiegel, et al., Pattern Recognition and Classification for Multivariate Time Series; 2011 ACM; [retrieved on Jan. 30, 2016]; Retrieved from Internet <URL:http://dl.acm.org/citation.cfm?id=2003657>;pp. 34-46.*

(Continued)

*Primary Examiner* — Xi D Chen
(74) *Attorney, Agent, or Firm* — Schwabe, Williamson & Wyatt

(57) ABSTRACT

A system and methods are disclosed for providing integrated software development environment for the design, verification and validation of advanced automotive safety systems. The system allows automotive software to be developed on a host computer using a collection of computer programs running simultaneously as processes and synchronized by a central process. The software disclosed uses separate synchronized processes, permitting signals from disparate sources to be generated by a simulation running on the host computer or from actual sensors and data bus signals coming from and going to actual vehicle hardware which is connected to their bus counterparts in the host computer on a real-time basis. The methods provide a data model that first extends the capabilities of the physical data model and then translates, gates, optimizes, fuses, filters and manages the physical representation of the logical model into a state estimation of the situation around the vehicle.

12 Claims, 30 Drawing Sheets

Block Diagram Of The SACore IMM For APAT

(56) References Cited

U.S. PATENT DOCUMENTS

| | | | |
|---|---|---|---|
| 4,829,434 A | 5/1989 | Karmel | |
| 4,835,537 A | 5/1989 | Manion | |
| 4,907,159 A | 3/1990 | Mauge | |
| 4,931,930 A | 6/1990 | Shyu et al. | |
| 4,959,800 A * | 9/1990 | Woolley | 235/411 |
| 5,008,678 A | 4/1991 | Herman | |
| 5,027,432 A | 6/1991 | Skala | |
| 5,031,330 A | 7/1991 | Stuart | |
| 5,045,937 A | 9/1991 | Myrick | |
| 5,111,401 A | 5/1992 | Everett, Jr. | |
| 5,115,245 A | 5/1992 | Wen | |
| 5,243,640 A | 9/1993 | Hadley et al. | |
| 5,245,909 A | 9/1993 | Corrigan | |
| 5,287,199 A | 2/1994 | Zoccolillo | |
| 5,303,297 A | 4/1994 | Hillis | |
| 5,339,086 A | 8/1994 | DeLuca | |
| 5,341,301 A | 8/1994 | Shirai | |
| 5,438,361 A | 8/1995 | Coleman | |
| 5,440,726 A | 8/1995 | Fuchs et al. | |
| 5,450,325 A * | 9/1995 | Rodriguez | G01C 22/002 701/527 |
| 5,471,214 A | 11/1995 | Faibish | |
| 5,485,892 A | 1/1996 | Fujita | |
| 5,500,794 A | 3/1996 | Fujita et al. | |
| 5,506,963 A | 4/1996 | Ducateau | |
| 5,532,706 A | 7/1996 | Reinhardt | |
| 5,537,539 A | 7/1996 | Narihiro | |
| 5,552,773 A | 9/1996 | Kuhnert | |
| 5,555,503 A | 9/1996 | Kyrtsos et al. | |
| 5,572,201 A | 11/1996 | Graham | |
| 5,579,219 A | 11/1996 | Mori et al. | |
| 5,581,462 A | 12/1996 | Rogers | |
| 5,585,798 A | 12/1996 | Yoshioka | |
| 5,617,085 A | 4/1997 | Tsutsumi | |
| 5,646,612 A | 7/1997 | Byon | |
| 5,661,811 A | 8/1997 | Huemann et al. | |
| 5,742,141 A | 4/1998 | Czekaj | |
| 5,749,060 A | 5/1998 | Graf | |
| 5,751,211 A | 5/1998 | Nishimura | |
| 5,754,123 A | 5/1998 | Nashif et al. | |
| 5,761,320 A | 6/1998 | Farinelli | |
| 5,786,998 A | 7/1998 | Neeson | |
| 5,787,246 A | 7/1998 | Lichtman | |
| 5,793,366 A | 8/1998 | Mano et al. | |
| 5,794,164 A | 8/1998 | Beckert et al. | |
| 5,832,396 A * | 11/1998 | Moroto | B60K 6/485 701/527 |
| 5,859,878 A | 1/1999 | Phillips et al. | |
| 5,872,508 A | 2/1999 | Taoka | |
| 5,898,392 A | 4/1999 | Bambini et al. | |
| 5,907,293 A | 5/1999 | Tognazzini | |
| 5,909,559 A | 6/1999 | So | |
| 5,915,214 A | 6/1999 | Reece | |
| 5,943,427 A | 8/1999 | Massie | |
| 5,948,040 A | 9/1999 | DeLorme et al. | |
| 5,951,620 A | 9/1999 | Ahrens et al. | |
| 5,956,016 A | 9/1999 | Kuenzner et al. | |
| 5,956,025 A | 9/1999 | Goulden et al. | |
| 5,956,250 A | 9/1999 | Gudat et al. | |
| 5,957,985 A | 9/1999 | Wong | |
| 5,959,536 A | 9/1999 | Chambers | |
| 5,963,092 A | 10/1999 | VanZalinge | |
| 5,964,822 A | 10/1999 | Alland | |
| 5,966,658 A | 10/1999 | Kennedy, III | |
| 5,969,598 A | 10/1999 | Kimura | |
| 5,974,554 A | 10/1999 | Oh | |
| 5,977,906 A | 11/1999 | Ameen | |
| 5,983,092 A | 11/1999 | Whinnett | |
| 5,983,161 A | 11/1999 | Lemelson | |
| 6,009,330 A | 12/1999 | Kennedy, III | |
| 6,009,403 A | 12/1999 | Sato | |
| 6,028,537 A | 2/2000 | Suman | |
| 6,028,548 A | 2/2000 | Farmer | |
| 6,032,089 A | 2/2000 | Buckley | |
| 6,032,202 A | 2/2000 | Lea et al. | |
| 6,037,860 A | 3/2000 | Zander et al. | |
| 6,038,625 A | 3/2000 | Ogino et al. | |
| 6,052,632 A | 4/2000 | Iihoshi | |
| 6,054,950 A | 4/2000 | Fontana | |
| 6,060,989 A | 5/2000 | Gehlot | |
| 6,061,002 A | 5/2000 | Weber et al. | |
| 6,061,709 A | 5/2000 | Bronte | |
| 6,075,467 A | 6/2000 | Ninagawa | |
| 6,097,285 A | 8/2000 | Curtin | |
| 6,097,314 A | 8/2000 | Desens et al. | |
| 6,105,119 A | 8/2000 | Kerr et al. | |
| 6,128,608 A | 10/2000 | Barnhill | |
| 6,144,336 A | 11/2000 | Preston | |
| 6,148,261 A | 11/2000 | Obradovich | |
| 6,150,961 A | 11/2000 | Alewine | |
| 6,154,123 A | 11/2000 | Kleinberg | |
| 6,161,071 A | 12/2000 | Shuman | |
| 6,163,711 A | 12/2000 | Juntunen | |
| 6,166,627 A | 12/2000 | Reeley | |
| 6,167,253 A | 12/2000 | Farris | |
| 6,169,894 B1 | 1/2001 | McCormick | |
| 6,175,728 B1 | 1/2001 | Mitama | |
| 6,175,782 B1 | 1/2001 | Obradovich | |
| 6,179,489 B1 | 1/2001 | So et al. | |
| 6,181,922 B1 | 1/2001 | Iwai | |
| 6,181,994 B1 | 1/2001 | Colson | |
| 6,182,006 B1 | 1/2001 | Meek | |
| 6,185,491 B1 | 2/2001 | Gray | |
| 6,195,760 B1 | 2/2001 | Chung et al. | |
| 6,198,996 B1 | 3/2001 | Berstis | |
| 6,199,136 B1 | 3/2001 | Shteyn | |
| 6,202,027 B1 | 3/2001 | Alland | |
| 6,203,366 B1 | 3/2001 | Muller | |
| 6,204,804 B1 | 3/2001 | Andersson | |
| 6,226,389 B1 | 5/2001 | Lemelson, III | |
| 6,233,468 B1 | 5/2001 | Chen | |
| 6,236,652 B1 | 5/2001 | Preston | |
| 6,240,365 B1 | 5/2001 | Bunn | |
| 6,243,450 B1 | 6/2001 | Jansen | |
| 6,243,645 B1 | 6/2001 | Moteki et al. | |
| 6,243,772 B1 | 6/2001 | Ghori et al. | |
| 6,247,079 B1 | 6/2001 | Papa et al. | |
| 6,247,144 B1 | 6/2001 | Macias-Garza et al. | |
| 6,252,544 B1 | 6/2001 | Hoffberg | |
| 6,275,231 B1 | 8/2001 | Obradovich | |
| 6,282,714 B1 | 8/2001 | Ghori et al. | |
| D448,366 S | 9/2001 | Youngers | |
| 6,292,109 B1 | 9/2001 | Murano | |
| 6,292,136 B1 * | 9/2001 | Egnell | 342/432 |
| 6,292,747 B1 | 9/2001 | Amro | |
| 6,294,987 B1 | 9/2001 | Matsuda | |
| 6,295,541 B1 | 9/2001 | Bodnar et al. | |
| 6,297,732 B2 | 10/2001 | Hsu | |
| 6,298,302 B2 | 10/2001 | Walgers | |
| 6,298,370 B1 | 10/2001 | Tang et al. | |
| 6,314,326 B1 | 11/2001 | Fuchu | |
| 6,321,344 B1 | 11/2001 | Fenchel | |
| 6,326,903 B1 | 12/2001 | Gross | |
| 6,327,536 B1 | 12/2001 | Tsuji | |
| 6,362,748 B1 | 3/2002 | Huang | |
| 6,370,449 B1 | 4/2002 | Razavi et al. | |
| 6,374,286 B1 | 4/2002 | Gee | |
| 6,377,860 B1 | 4/2002 | Gray | |
| 6,382,897 B2 | 5/2002 | Mattio | |
| 6,389,340 B1 | 5/2002 | Rayner | |
| 6,401,029 B1 | 6/2002 | Kubota | |
| 6,405,132 B1 | 6/2002 | Breed | |
| 6,408,174 B1 | 6/2002 | Steijer | |
| 6,417,782 B1 | 7/2002 | Darnall | |
| 6,421,429 B1 | 7/2002 | Merritt | |
| 6,429,789 B1 | 8/2002 | Kiridena | |
| 6,429,812 B1 | 8/2002 | Hoffberg | |
| 6,430,164 B1 | 8/2002 | Jones | |
| 6,433,679 B1 | 8/2002 | Schmid | |
| 6,434,447 B1 | 8/2002 | Shteyn | |
| 6,442,485 B2 | 8/2002 | Evans | |
| 6,445,308 B1 | 9/2002 | Koike | |
| 6,445,983 B1 * | 9/2002 | Dickson et al. | 701/23 |
| 6,449,541 B1 | 9/2002 | Goldberg et al. | |

(56) References Cited

U.S. PATENT DOCUMENTS

| | | | | |
|---|---|---|---|---|
| 6,452,484 | B1 | 9/2002 | Drori | |
| 6,463,373 | B2 | 10/2002 | Suganuma | |
| 6,484,080 | B2 | 11/2002 | Breed | |
| 6,487,717 | B1 | 11/2002 | Brunemann et al. | |
| 6,489,884 | B1 | 12/2002 | Lamberson et al. | |
| 6,493,338 | B1 | 12/2002 | Preston | |
| 6,496,107 | B1 | 12/2002 | Himmelstein | |
| 6,496,117 | B2 | 12/2002 | Gutta | |
| 6,496,689 | B1 | 12/2002 | Keller | |
| 6,498,939 | B1 | 12/2002 | Thomas | |
| 6,505,100 | B1 | 1/2003 | Stuempfle | |
| 6,515,595 | B1 | 2/2003 | Obradovich | |
| 6,522,875 | B1 | 2/2003 | Dowling | |
| 6,523,696 | B1 | 2/2003 | Saito et al. | |
| 6,526,335 | B1 | 2/2003 | Treyz et al. | |
| 6,542,812 | B1 | 4/2003 | Obradovich et al. | |
| 6,542,814 | B2 | 4/2003 | Polidi et al. | |
| 6,559,773 | B1 | 5/2003 | Berry | |
| 6,567,069 | B1 | 5/2003 | Bontrager et al. | |
| 6,571,136 | B1 | 5/2003 | Staiger | |
| 6,574,734 | B1 | 6/2003 | Colson et al. | |
| 6,580,973 | B2 * | 6/2003 | Leivian et al. | 701/1 |
| 6,584,403 | B2 | 6/2003 | Bunn | |
| 6,611,755 | B1 * | 8/2003 | Coffee | B28C 5/422 701/482 |
| D479,228 | S | 9/2003 | Sakaguchi et al. | |
| 6,614,349 | B1 | 9/2003 | Proctor et al. | |
| 6,615,137 | B2 | 9/2003 | Lutter | |
| 6,616,071 | B2 | 9/2003 | Kitamura | |
| 6,622,083 | B1 | 9/2003 | Knockeart | |
| 6,629,033 | B2 | 9/2003 | Preston | |
| 6,641,087 | B1 | 11/2003 | Nelson | |
| 6,647,270 | B1 | 11/2003 | Himmelstein | |
| 6,647,328 | B2 | 11/2003 | Walker | |
| 6,670,912 | B2 | 12/2003 | Honda | |
| 6,675,081 | B2 | 1/2004 | Shuman | |
| 6,678,892 | B1 | 1/2004 | Lavelle et al. | |
| 6,681,121 | B1 | 1/2004 | Preston | |
| 6,690,681 | B1 | 2/2004 | Preston | |
| 6,707,421 | B1 | 3/2004 | Drury et al. | |
| 6,708,100 | B2 | 3/2004 | Russell | |
| 6,714,139 | B2 | 3/2004 | Saito | |
| 6,718,187 | B1 | 4/2004 | Takagi et al. | |
| 6,721,658 | B2 * | 4/2004 | Stadter | B64G 1/1085 701/482 |
| 6,725,031 | B2 | 4/2004 | Watler | |
| 6,734,799 | B2 | 5/2004 | Munch | |
| 6,738,697 | B2 | 5/2004 | Breed | |
| 6,748,278 | B1 | 6/2004 | Maymudes et al. | |
| 6,754,183 | B1 | 6/2004 | Razavi et al. | |
| 6,756,998 | B1 | 6/2004 | Bilger | |
| 6,765,495 | B1 | 7/2004 | Dunning et al. | |
| 6,771,208 | B2 | 8/2004 | Lutter | |
| 6,771,629 | B1 | 8/2004 | Preston | |
| 6,778,073 | B2 | 8/2004 | Lutter | |
| 6,778,924 | B2 | 8/2004 | Hanse | |
| 6,782,315 | B2 | 8/2004 | Lu | |
| 6,785,551 | B1 | 8/2004 | Richard | |
| 6,792,351 | B2 | 9/2004 | Lutter | |
| 6,799,092 | B2 | 9/2004 | Lu | |
| 6,801,994 | B2 | 10/2004 | Becket et al. | |
| 6,806,977 | B1 | 10/2004 | Freeny et al. | |
| 6,816,458 | B1 | 11/2004 | Kroon | |
| 6,876,642 | B1 | 4/2005 | Adams | |
| 6,892,230 | B1 | 5/2005 | Gu et al. | |
| 6,895,238 | B2 | 5/2005 | Newell | |
| 6,895,240 | B2 | 5/2005 | Laursen | |
| 6,901,057 | B2 | 5/2005 | Rune | |
| 6,906,619 | B2 | 6/2005 | Williams | |
| 6,917,801 | B2 | 7/2005 | Witte et al. | |
| 6,920,129 | B2 | 7/2005 | Preston | |
| 6,925,368 | B2 | 8/2005 | Funkhouser et al. | |
| 6,937,732 | B2 | 8/2005 | Ohmura | |
| 6,952,155 | B2 | 10/2005 | Himmelstein | |
| 6,968,513 | B1 | 11/2005 | Rinebold et al. | |
| 6,972,669 | B2 | 12/2005 | Saito | |
| 6,973,030 | B2 | 12/2005 | Pecen | |
| 6,980,092 | B2 | 12/2005 | Turnbull | |
| 6,993,511 | B2 | 1/2006 | Himmelstein | |
| 7,000,469 | B2 | 2/2006 | Foxlin | |
| 7,006,950 | B1 | 2/2006 | Greiffenhagen | |
| 7,024,363 | B1 | 4/2006 | Comerford | |
| 7,039,858 | B2 | 5/2006 | Humpleman et al. | |
| 7,079,993 | B2 | 7/2006 | Stephenson | |
| 7,085,710 | B1 | 8/2006 | Beckert et al. | |
| 7,089,206 | B2 | 8/2006 | Martin | |
| 7,092,723 | B2 | 8/2006 | Himmelstein | |
| 7,103,646 | B1 | 9/2006 | Suzuki | |
| 7,103,834 | B1 | 9/2006 | Humpleman et al. | |
| 7,120,129 | B2 | 10/2006 | Ayyagari | |
| 7,123,926 | B2 | 10/2006 | Himmelstein | |
| 7,146,260 | B2 | 12/2006 | Preston | |
| 7,151,768 | B2 | 12/2006 | Preston | |
| 7,158,842 | B2 | 1/2007 | Ohmura | |
| 7,158,956 | B1 | 1/2007 | Himmelstein | |
| 7,164,662 | B2 | 1/2007 | Preston | |
| 7,171,189 | B2 | 1/2007 | Bianconi | |
| 7,178,049 | B2 | 2/2007 | Lutter | |
| 7,187,947 | B1 | 3/2007 | White | |
| 7,206,305 | B2 | 4/2007 | Preston | |
| 7,207,042 | B2 | 4/2007 | Smith | |
| 7,215,965 | B2 | 5/2007 | Fournier et al. | |
| 7,216,347 | B1 | 5/2007 | Harrison et al. | |
| 7,221,669 | B2 | 5/2007 | Preston | |
| 7,239,949 | B2 | 7/2007 | Lu | |
| 7,249,266 | B2 | 7/2007 | Margalit | |
| 7,257,426 | B1 | 8/2007 | Witkowski | |
| 7,263,332 | B1 | 8/2007 | Nelson | |
| 7,269,188 | B2 | 9/2007 | Smith | |
| 7,272,637 | B1 | 9/2007 | Himmelstein | |
| 7,274,988 | B2 | 9/2007 | Mukaiyama | |
| 7,277,693 | B2 | 10/2007 | Chen | |
| 7,283,567 | B2 | 10/2007 | Preston | |
| 7,283,904 | B2 | 10/2007 | Benjamin | |
| 7,286,522 | B2 | 10/2007 | Preston | |
| 7,289,906 | B2 * | 10/2007 | van der Merwe et al. | 701/472 |
| 7,317,696 | B2 | 1/2008 | Preston | |
| 7,337,650 | B1 | 3/2008 | Preston | |
| 7,343,160 | B2 | 3/2008 | Morton | |
| 7,375,728 | B2 | 5/2008 | Donath | |
| 7,379,707 | B2 | 5/2008 | DiFonzo | |
| 7,411,982 | B2 | 8/2008 | Smith | |
| 7,418,476 | B2 | 8/2008 | Salesky | |
| 7,426,437 | B2 | 9/2008 | Breed | |
| 7,450,955 | B2 | 11/2008 | Himmelstein | |
| 7,480,501 | B2 | 1/2009 | Petite | |
| 7,483,964 | B1 | 1/2009 | Jackson et al. | |
| 7,484,008 | B1 | 1/2009 | Gelvin | |
| 7,493,645 | B1 | 2/2009 | Tranchina | |
| 7,506,020 | B2 | 3/2009 | Ellis | |
| 7,508,810 | B2 | 3/2009 | Moinzadeh | |
| 7,509,134 | B2 | 3/2009 | Fournier et al. | |
| 7,536,277 | B2 * | 5/2009 | Pattipatti et al. | 702/183 |
| 7,579,942 | B2 * | 8/2009 | Kalik | 340/435 |
| 7,587,102 | B2 * | 9/2009 | Maris | 382/291 |
| 7,587,370 | B2 | 9/2009 | Himmelstein | |
| 7,594,000 | B2 | 9/2009 | Himmelstein | |
| 7,596,391 | B2 | 9/2009 | Himmelstein | |
| 7,599,715 | B2 | 10/2009 | Himmelstein | |
| 7,610,331 | B1 | 10/2009 | Genske | |
| 7,614,055 | B2 | 11/2009 | Buskens et al. | |
| 7,664,315 | B2 | 2/2010 | Woodfill | |
| 7,681,448 | B1 | 3/2010 | Preston | |
| 7,689,321 | B2 * | 3/2010 | Karlsson | 700/253 |
| 7,733,853 | B2 | 6/2010 | Moinzadeh et al. | |
| 7,747,281 | B2 | 6/2010 | Preston | |
| 7,778,739 | B2 | 8/2010 | Preston et al. | |
| 7,848,763 | B2 | 12/2010 | Fournier et al. | |
| 7,891,004 | B1 | 2/2011 | Gelvin | |
| 7,924,934 | B2 | 4/2011 | Birmingham | |
| 7,928,898 | B2 * | 4/2011 | Fraenken | 342/107 |
| 7,966,111 | B2 | 6/2011 | Moinzadeh et al. | |
| 7,970,500 | B2 * | 6/2011 | Parra Carque | 701/7 |
| 7,979,095 | B2 | 7/2011 | Birmingham | |

(56) References Cited

U.S. PATENT DOCUMENTS

| | | | |
|---|---|---|---|
| 7,983,310 | B2 | 7/2011 | Hirano et al. |
| 8,014,942 | B2 | 9/2011 | Moinzadeh et al. |
| 8,036,201 | B2 | 10/2011 | Moinzadeh et al. |
| 8,036,600 | B2 | 10/2011 | Garrett et al. |
| 8,045,729 | B2 | 10/2011 | Preston et al. |
| 8,063,347 | B1* | 11/2011 | Urbano et al. ............... 244/3.1 |
| 8,068,792 | B2 | 11/2011 | Preston |
| 8,108,092 | B2 | 1/2012 | Phillips et al. |
| 8,165,057 | B2 | 4/2012 | Preston et al. |
| 8,165,728 | B2* | 4/2012 | Schultz ............... G01S 5/0027 701/482 |
| 8,180,507 | B2* | 5/2012 | Dokken ............. G01S 13/9307 701/469 |
| 8,204,927 | B1* | 6/2012 | Duong et al. ................. 708/819 |
| 8,244,408 | B2* | 8/2012 | Lee et al. ....................... 700/301 |
| 8,255,697 | B2 | 8/2012 | Mathiassen |
| 8,260,515 | B2* | 9/2012 | Huang et al. ..................... 701/70 |
| 8,331,279 | B2 | 12/2012 | Preston et al. |
| 8,346,186 | B1 | 1/2013 | Preston et al. |
| 8,374,783 | B2* | 2/2013 | Takac ................... A01B 79/005 701/469 |
| 8,751,712 | B2 | 6/2014 | Preston et al. |
| 8,761,821 | B2 | 6/2014 | Tibbitts |
| 8,948,995 | B2* | 2/2015 | Pandita ................. B60W 30/17 701/482 |
| 8,958,315 | B2 | 2/2015 | Preston et al. |
| 8,963,736 | B2 | 2/2015 | Millar |
| 8,965,688 | B2* | 2/2015 | Bandyopadhyay .... G01C 17/38 701/482 |
| 9,020,755 | B1* | 4/2015 | Gazit ..................... G01S 19/41 701/469 |
| 2001/0009855 | A1 | 7/2001 | L'Anson |
| 2002/0012329 | A1 | 1/2002 | Atkinson |
| 2002/0017567 | A1 | 2/2002 | Connolly et al. |
| 2002/0022927 | A1 | 2/2002 | Lemelson et al. |
| 2002/0070852 | A1 | 6/2002 | Trauner |
| 2002/0083143 | A1 | 6/2002 | Cheng |
| 2002/0095501 | A1 | 7/2002 | Chiloyan et al. |
| 2002/0105423 | A1 | 8/2002 | Rast |
| 2002/0144010 | A1 | 10/2002 | Younis |
| 2002/0144079 | A1 | 10/2002 | Willis et al. |
| 2003/0055553 | A1* | 3/2003 | Knockeart ......... G01C 21/3415 701/469 |
| 2003/0060188 | A1 | 3/2003 | Gidron |
| 2003/0078754 | A1* | 4/2003 | Hamza .......................... 702/150 |
| 2003/0158614 | A1 | 8/2003 | Friel |
| 2003/0204382 | A1* | 10/2003 | Julier et al. .................... 702/196 |
| 2003/0212996 | A1 | 11/2003 | Wolzien |
| 2004/0162064 | A1 | 8/2004 | Himmelstein |
| 2004/0164228 | A1 | 8/2004 | Fogg |
| 2005/0009506 | A1 | 1/2005 | Smolentzov |
| 2005/0070221 | A1 | 3/2005 | Upton |
| 2005/0130656 | A1 | 6/2005 | Chen |
| 2005/0153654 | A1 | 7/2005 | Anderson |
| 2005/0232469 | A1 | 10/2005 | Schofield et al. |
| 2005/0251328 | A1 | 11/2005 | Merwe et al. |
| 2005/0260984 | A1 | 11/2005 | Karabinis |
| 2005/0275505 | A1 | 12/2005 | Himmelstein |
| 2005/0278712 | A1 | 12/2005 | Buskens et al. |
| 2006/0132357 | A1* | 6/2006 | Pozgay et al. ................. 342/174 |
| 2006/0206576 | A1 | 9/2006 | Obradovich et al. |
| 2006/0293829 | A1 | 12/2006 | Cornwell et al. |
| 2007/0115868 | A1 | 5/2007 | Chen |
| 2007/0115897 | A1 | 5/2007 | Chen |
| 2007/0260372 | A1 | 11/2007 | Langer et al. |
| 2007/0260373 | A1 | 11/2007 | Langer et al. |
| 2008/0092140 | A1 | 4/2008 | Doninger et al. |
| 2008/0169998 | A1 | 7/2008 | Jacobsen et al. |
| 2009/0090592 | A1 | 4/2009 | Mordukhovich et al. |
| 2009/0240481 | A1* | 9/2009 | Durrant-Whyte et al. ........ 703/7 |
| 2009/0268923 | A1 | 10/2009 | Li |
| 2009/0268947 | A1* | 10/2009 | Schaufler ....................... 382/104 |
| 2009/0284378 | A1* | 11/2009 | Ferren et al. ............... 340/573.1 |
| 2009/0319063 | A1 | 12/2009 | Pan |
| 2010/0017543 | A1 | 1/2010 | Preston et al. |
| 2011/0212700 | A1 | 9/2011 | Petite |
| 2011/0238307 | A1* | 9/2011 | Psiaki ................... G01C 21/28 701/469 |
| 2012/0083971 | A1 | 4/2012 | Preston et al. |
| 2012/0183153 | A1 | 7/2012 | Preston et al. |
| 2013/0304347 | A1* | 11/2013 | Davidson ............. G06Q 10/083 701/527 |
| 2013/0304348 | A1* | 11/2013 | Davidson ............. G06Q 10/083 701/527 |
| 2013/0304349 | A1* | 11/2013 | Davidson ............. G08G 1/0112 701/527 |

FOREIGN PATENT DOCUMENTS

| | | |
|---|---|---|
| DE | 19922608 | 11/2000 |
| DE | 19931161 | 1/2001 |
| EP | 0 441 576 A2 | 8/1991 |
| EP | 841648 | 5/1998 |
| EP | 1 355 128 | 10/2003 |
| GB | 2097563 | 11/1982 |
| JP | 10-076115 | 10/1999 |
| JP | 2000207691 A | 7/2000 |
| WO | WO9624229 A1 | 8/1996 |
| WO | WO9908436 A1 | 2/1999 |
| WO | WO9957662 A2 | 11/1999 |
| WO | WO9965183 A2 | 12/1999 |
| WO | WO 0029948 | 5/2000 |
| WO | WO0040038 A2 | 7/2000 |
| WO | WO0130061 A1 | 4/2001 |
| WO | WO0158110 A2 | 8/2001 |

OTHER PUBLICATIONS

Huang, et al., Dynamic Highway Congestion Dectection and Prediction Based on Shock Waves; 2010 ACM; [retrieved on Jan. 30, 2016]; Retrieved from Internet <URL:http://dl.acm.org/citation.cfm?id=1860061>;pp. 11-20.*

Hsu, et al., Implementation of Car-Following System using LiDAR Dection; 2012 IEEE; [retrieved on Jan. 30, 2016]; Retrieved from Internet <URL:http://ieeexplore.ieee.org/stamp/stamp.jsp?tp=&arnumber=6425157>;pp. 165-169.*

Chen, et al., An Arterial Speed Estimation Model Fusing Data from Stationary and Mobile Sensors; 2001 IEEE; [retrieved on Jan. 30, 2016]; Retrieved from Internet <URL:http://ieeexplore.ieee.org/stamp/stamp.jsp?tp=&arnumber=948723>;pp. 573-578.*

Stolowitz Ford Cowger LLP, Listing of Related Cases, Feb. 4, 2011.

Stolowitz Ford Cowger LLP, Listing of Related Cases, Mar. 15, 2011.

A. Das, R. Fierro, V. Kumar, J. Ostrowski, J. Spletzer, and C. Taylor, "A Framework for Vision Based Formation Control", IEEE Transactions on Robotics and Automation, vol. 18, Nov. 5, 2001, pp. 1-13.

Ada 95 Transition Support—Lessons Learned, Sections 3, 4, and 5, CACI, Inc. -Federal, Nov. 15, 1996, 14 pages.

AMIC. Architecture specification release 1, 2001; 35 pages.

Bluetooth Doc; Advance Audio Distribution Profile Specification; Adopted version 1.0; dated May 22, 2003; 75 pages.

Bluetooth Doc; Audio/Video Remote Control Profile; Version 1.0 Adopted; dated May 22, 2003; 52 pages.

Bluetooth Hands-free Profile 1.5 Nov. 25, 2005.

Bluetooth Specification version 1.1; Feb. 22, 2001; 452 pages.

Boeing News Release, "Boeing Demonstrates JSF Avionics Multi-Sensor Fusion", Seattle, WA, May 9, 2000, pp. 1-2.

Boeing Statement, "Chairman and CEO Phil Condit on the JSF Decision", Washington, D.C., Oct. 26, 2001, pp. 1-2.

Counterair: The Cutting Edge, Ch. 2 "The Evolutionary Trajectory the Fighter Pilot-Here to Stay?" AF2025 v3c8-2, Dec. 1996, pp. 1-7.

Counterair: The Cutting Edge, Ch. 4 "The Virtual Trajectory Air Superiority without an "Air" Force?" AF2025 v3c8-4, Dec. 1996, pp. 1-12.

Embedded Bluetooth Migrates to Lisbon and Seattle; 11 pages; Jan. 23, 2008.

Green Hills Software, Inc., "The AdaMULTI 2000 Integrated Development Environment," Copyright 2002, printed Jul. 9, 2002; 7 pages.

(56) References Cited

OTHER PUBLICATIONS

H. Chung, L. Ojeda, and J. Borenstein, "Sensor Fusion for Mobile Robot Dead-reckoning with a Precision-calibrated Fiber Optic Gyroscope", 2001 IEEE International Conference on Robotics and Automation, Seoul, Korea, May 21-26, 2001, pp. 1-6.
Hitachi Automated Highway System (AHS), Automotive Products, Hitachi, Ltd., Copyright 1994-2002, 8 pages.
IEEE Standard for Information Technology—POSIX Based Supercomputing Application Environment Profile; Jun. 14, 1995, 72 pages.
ISIS Project: Sensor Fusion, Linkoping University Division of Automatic Control and Communication Systems in cooperation with SAAB (Dynamics and Aircraft), 2001, 18 pages.
J. Takezaki, N. Ueki, T. Minowa, H. Kondoh, "Support System for Safe Driving—A Step Toward ITS Autonomous Driving—", Hitachi Review, vol. 49, Nov. 3, 2000, pp. 1-8.
Joint Strike Fighter Terrain Database, ets-news.com "Simulator Solutions" 2002, 3 pages.
Luttge, Karsten; "E-Charging API: Outsource Charging to a Payment Service Provider"; IEEE; 2001 (pp. 216-222).
M. Chantler, G. Russel, and R. Dunbar, "Probabilistic Sensor Fusion for Reliable Workspace Sensing", Fourth IARP workshop on Underwater Robotics, Genoa, Nov. 1992, pp. 1-14.
MSRC Redacted Proposal, 3.0 Architecture Development, Aug. 29, 2002; pp. 1-43.
MyGig User Guide.
Powerpoint Presentation by Robert Allen—Boeing Phantom Works entitled "Real-Time Embedded Avionics System Security and COTS Operating Systems", Open Group Real-Time Forum, Jul. 18, 2001, 16 pages.
Product description of Raytheon Electronic Systems (ES), Copyright 2002, pp. 1-2.
Product description of Raytheon RT Secure, "Development Environment", Copyright 2001, pp. 1-2.
Product description of Raytheon RT Secure, "Embedded Hard Real-Time Secure Operating System", Copyright 2000, pp. 1-2.
Product description of Raytheon RT Secure, Copyright 2001, pp. 1-2.
S.G. Goodridge, "Multimedia Sensor Fusion for Intelligent Camera Control and Human-Computer Interaction", Dissertation submitted to the Graduate Faculty of North Carolina State University in partial fulfillment of the requirements for the degree of Doctor of Philosophy in Electrical Engineering, Raleigh, NC, 1997, pp. 1-5.
Specification of the Bluetooth System v1.0.8; Dec. 1, 1999.
Specification of the Bluetooth System v1.1; Feb. 22, 2001.

TNO FEL Annual Review 1998: Quality works, Observation Systems Division; "The Whole is More Than the Sum of its Parts"; 16 pages.
Vehicle Dynamics Lab, University of California, Berkeley, funded by BMW, current members: D. Caveney and B. Feldman, "Adaptive Cruise Control", at least as early as 2002, printed Jul. 2, 2002; 17 pages.
Stirling A: "Mobile Multimedia platforms" Vehicular Technology Conferene Fall 2000. IEEE VTS Fall VTC2000. 52nd Vehicular Technology Conference (CAT. No. 00CH37152).
Nusser R. et al.: "Bluetooth-based wireless connectivity in an automotive environment" Vehicular Technoloty Conference Fall 2000. IEEE VTS Fall VTC2000 52nd Vehicular Techonlogy Conference (Cat. No. 00CH37152).
Martins e f v et al. "design of an OS9 operating system extension for a message-passing multiprocesor" Microprocessors and Microsysetms, IPC Business Press LT. London, BG, vol. 21, No. 9, Apr. 1, 1998, pp. 533-543.
Gutierrez Garcia JJ et al. "Minimizing the effects of jitter in distributed hard real-time systems" Journal of Systems Architecture, Elsevier Science Publishers BV., Amsterdam, NL, vol. 41, No. 6/7. Dec. 15, 1996, pp. 431-447.
International Search Report for PCT/US02/020402; Mailing date Apr. 3, 2003.
International Search Report for PCT/US02/020403; Mailing date Jan. 27, 2003.
International Search Report for PCT/US02/016364; Mailing date Feb. 14, 2003.
International Search Report for PCT/US02/016371; Mailing date Aug. 18, 2003.
Stolowitz Ford Cowger LLP, Listing of Related Cases, May 10, 2010.
Stolowitz Ford Cowger LLP Listing of Related Cases Sep. 17, 2012.
MyGig User Guide; Mar. 11, 2008.
Stolowitz Ford Cowger LLP Listing of Related Cases; Oct. 12, 2011.
Longbin, Xiaoquain, Yizu Kang, Bar-Shalom: Unbiased converted measurements for tracking; IEEE Transactions on Aerospace and Electronic Systems vol. 34(4), Jul. 1998, pp. 1023-1027.
Miller, Drummond: Comparison of methodologies for mitigating coordinate transformation basis in target tracking; Proceedings SPIE Conference on Signal and Data Processing of Small Targets 2000, vol. 4048, Jul. 2002, pp. 414-426.
Duan, Han, Rong Li: Comments on "Unbiased (debiased) converted measurements for tracking" IEEE Transactions on Aerospace and Electronic Systems, vol. 40(4), Oct. 2004, pp. 1374-1377.

* cited by examiner

Block Diagram Of The SACore IMM For APAT

Validation Region For Two Tracks And Five Measurements

| θ | Events | $\delta_1$ | $\delta_2$ | $\tau_1$ | $\tau_2$ | $\tau_3$ | $\varphi$ | $\gamma$ |
|---|---|---|---|---|---|---|---|---|
| 1 | $\theta_{01}, \theta_{02}, \theta_{03}$ | 0 | 0 | 0 | 0 | 0 | 3 | $3!(1-P_D)^2/V^3$ |
| 2 | $\theta_{11}, \theta_{02}, \theta_{03}$ | 1 | 0 | 1 | 0 | 0 | 2 | $2!P_D(1-P_D)\Lambda_{11}/V^2$ |
| 3 | $\theta_{01}, \theta_{12}, \theta_{03}$ | 1 | 0 | 0 | 1 | 0 | 2 | $2!P_D(1-P_D)\Lambda_{12}/V^2$ |
| 4 | $\theta_{01}, \theta_{22}, \theta_{03}$ | 0 | 1 | 0 | 1 | 0 | 2 | $2!P_D(1-P_D)\Lambda_{22}/V^2$ |
| 5 | $\theta_{01}, \theta_{02}, \theta_{23}$ | 0 | 1 | 0 | 0 | 1 | 2 | $2!P_D(1-P_D)\Lambda_{23}/V^2$ |
| 6 | $\theta_{11}, \theta_{22}, \theta_{03}$ | 1 | 1 | 1 | 1 | 0 | 1 | $P_D^2\Lambda_{11}\Lambda_{22}/V$ |
| 7 | $\theta_{11}, \theta_{02}, \theta_{23}$ | 1 | 1 | 1 | 0 | 1 | 1 | $P_D^2\Lambda_{11}\Lambda_{23}/V$ |
| 8 | $\theta_{01}, \theta_{12}, \theta_{23}$ | 1 | 1 | 0 | 1 | 1 | 1 | $P_D^2\Lambda_{12}\Lambda_{23}/V$ |

Figure 3

Feasible Joint Association Events For Figure 2

APAT Overview

Figure 5. APAT Model

APAT Process

APAT Process

Radar/Vision - 10 Hz/0 Hz Cross Range & Down Range Error

Radar/Vision - 10 Hz/3 Hz Cross Range & Down Range Error

Radar/Vision - 10 Hz/10 Hz Cross Range & Down Range Error

Radar/Vision - 10 Hz/25 Hz Cross Range & Down Range Error

Performance Improvements Aggregated

Performance Improvement

Performance Optimization

Converting From Polar To Cartesian Coordinates

Out-of-sequence-measurements

IMM Filters

IMM Filter Switching Passing Car

Right Curve - Car Ahead & Left True Trajectory Data

Right Curve - Car Ahead & Left True Relative Trajectory Data

IMM Filter Switching Right Curve - Car Ahead & Left

|  | Long range | Medium range |
|---|---|---|
| Max range | 200 meters | 60 meters |
| Min range | 1 meters | .5 meters |
| Horizontal FOV | 20 degrees | 90 degrees |
| Max range rate | 50 m/sec | 50 m/sec |
| Min range rate | -100 m/sec | -100 m/sec |
| Update interval | 50 millisecs | 50 millisecs |
| Range error 1-sigma | .2 meters | .1 meters |
| Angle error 1-sigma | .2 degrees | .4 degrees |
| Rrate error 1-sigma | .0025 m/sec | .0025 m/sec |

Figure 23

Simulated Radar Sensor Values (Table)

Host vehicle – straight ahead at 25 m/sec Target.

1. Approaching two lanes to the left at 25 m/sec.

2. Passing one lane to left at 35 m/sec.

3. Crossing from left to right at 25 m/sec.

4. Start ahead of host 100 meters. Slow down till 20 meters ahead and then speed up and turn off to the right.

5. Pass and cut in front of host and then cut back to left lane.

Host vehicle: Right 90 degree turn at 5 degs/sec and 25 m/sec.

Target: Ahead of host 25 meters and one lane left and making right 90 degree turn; Approaches host on the 90 degree curve at 25 m/sec one lane to the left.

Figure 24

Approaching Car True Relative Trajectory Data

Approaching Car True Relative Trajectory Data

Approaching Car - Radar Only Down Range Position Data (meters)

Approaching Car - Radar Only Down Range Velocity/Acceleration Data

Approaching Car - Radar Only Cross Range Position Data (meters)

Approaching Car - Radar Only Cross Range Velocity/Acceleration Data

SYSTEM AND METHOD FOR MODELING ADVANCED AUTOMOTIVE SAFETY SYSTEMS

RELATED FILINGS DATA

The present application claims priority to Provisional Patent Application Ser. No. 61/176,681 filed May 8, 2009 and to Provisional Patent Application Ser. No. 61/17,015 filed May 11, 2009 which is incorporated by reference in its entirety.

This application further incorporates by reference U.S. Patents:

U.S. Pat. No. 6,629,033 Issued Sep. 30, 2003 Titled—OPEN COMMUNICATION SYSTEM FOR REAL-TIME MULTIPROCESSOR APPLICATIONS;

U.S. Pat. No. 6,771,208 Issued Aug. 3, 2004 Titled—MULTI SENSOR SYSTEM;

U.S. Pat. No. 7,146,260 Issued Dec. 5, 2006 Titled—METHOD AND APPARATUS FOR DYNAMIC CONFIGURATION OF MULTIPROCESSOR SYSTEM;

U.S. Pat. No. 6,792,351 Issued Sep. 14, 2004 Titled—METHOD AND APPARATUS FOR MULTI-VEHICLE COMMUNICATION;

U.S. Pat. No. 6,778,073 Issued Aug. 17, 2004 Titled—METHOD AND APPARATUS FOR MANAGING AUDIO DEVICES;

U.S. Pat. No. 6,615,137 Issued Sep. 2, 2003 Titled—METHOD AND APPARATUS FOR TRANSFERRING INFORMATION BETWEEN VEHICLES;

U.S. Pat. No. 7,178,049 Issued Feb. 13, 2007 Titled—METHOD FOR MULTI-TASKING MULTIPLE JAVA VIRTUAL MACHINES;

U.S. Pat. No. 7,337,650 Issued Mar. 4, 2008 Titled—SYSTEM AND METHOD FOR ALIGNING SENSORS ON A VEHICLE.

COPYRIGHT NOTICE

Contained herein is material that is subject to copyright protection. The copyright owner has no objection to the facsimile reproduction by anyone of the patent document or the patent disclosure, as it appears in the United States Patent and Trademark Office patent file or records, but otherwise reserves all rights to the copyright whatsoever. The following notice applies to the software, screenshots and data as described below and in the drawings hereto and All Rights Reserved.

TECHNICAL FIELD OF THE INVENTION

This invention relates generally to statistical modeling and analysis of automotive safety systems, sensors and application requirements for both performance and cost tradeoffs. This invention relates specifically to the process of designing, building, testing and analyzing system data in a hierarchy of statistical models, driven by the need to implement advanced safety features for the transportation industry.

BACKGROUND

Next generation automotive systems will include numerous electronic systems such as; passive safety systems for airbag deployment and anti-skid braking features; active safety for collision warning and collision avoidance features; and convenience features for Blind Spot Detection (BSD) and Adaptive Cruise Control (ACC). Today the transportation industry is rapidly moving toward solutions that support and enable these systems and new features with the ultimate goal of profitably and developing a more survivable vehicle at costs their customers are willing to pay.

These new systems will require information about the environment, targets in the environment and our relationship to them. This information will be generated from multiple sources to include data from a new class of sensor, termed non-contact sensor, and include non-contact sensors like radar, optical, laser, ultrasonic, etc. These non-contact sensors will generate data about the environment including range measurements and target classification. These systems are similar to those found on advanced tactical fighter aircraft today.

The process of manufacturing a vehicle is not much different today then is was 50 years ago; features are specified for a desired model and year; parts designed; competitively purchased; assembled; and shipped as a complete vehicle. If another feature is desired, it is integrated into the design and bolted on as a complete feature; this approach is referred to as "federated" systems. A key tenant to low cost systems in the future will be a deliberate movement away from federated features and systems, to fully integrated systems design and integrated systems.

Now with a focus on active safety systems, the sensors required to support the features identified above are to some extent common; an optical sensor that supports one optical application could be used for a second optical application; two sensors could be used for one application. In either case, simply sharing data from sensors or other sources to improve knowledge of the environment is incorrectly termed "sensor-fusion" or "multi sensor-fusion" by the transportation industry suppliers.

Those skilled in the art of state estimation, robotics, advanced defense avionics understand academically that sensor-fusion is the art of combining sensory data or data derived from disparate sources such that the resulting information is in some sense "better" than would be possible when these sources were used individually. This process is predicated on the covariance (or the measure of how much two variables vary together) of non-independent sources. The term "better" in the case above can mean more accurate, more complete, more dependable, or refer to the result of an emerging view or state estimation.

The data sources for a fusion process are not specified to originate from identical sources or sensors which may or may not be spatially and temporally aligned. Further one can distinguish direct fusion, indirect fusion and fusion of the outputs of the former two. Direct fusion is the fusion of sensor data from a set of heterogeneous or homogeneous sensors, soft sensors, and history values of sensor data, while indirect fusion uses information sources like a prior knowledge about the environment and human input. Sensor fusion is also known as "multi-sensor data fusion" and is a subset of information fusion through an implementation of the probability theory.

Probability theory is the mathematical study of phenomena characterized by randomness or uncertainty. More precisely, probability is used for modeling situations when the result of a measurement, realized under the same circumstances, produces different results. Mathematicians and actuaries think of probabilities as numbers in the closed interval from 0 to 1 assigned to "events" whose occurrence or failure to occur is random. Two crucial concepts in the theory of probability are those of a random variable and of the probability distribution of a random variable.

Implementing the features described above with affordable instruments requires reliable real-time estimates of system state. Unfortunately, the complete state is not always observable. State Estimation takes all the data obtained and uses it to determine the underlying behavior of the system at any point in time. It includes fault detection, isolation and continuous system state estimation.

There are two parts to state estimation: modeling and algorithms. The overall approach is to use a model to predict the behavior of the system in a particular state, and then compare that behavior with the actual measurements from the instruments to determine which state or states is the most likely to produce the observed system behavior.

This is not well understood or currently implemented in the transportation industry; the approach understood and practiced is logical decisions in linear and deterministic systems. If use cases require higher confidences in measurements, instrument specifications are tightened resulting in the undesired effect of cost and schedule increases. The environment we live and operate in is neither linear nor deterministic; use cases are infinite; and the perverse variability of the targets and potential maneuvers cannot be modeled. The variability of the problem identified above includes aspects other than just spatial (i.e. range and bearing to a target); temporal relationships are part of the fundamental intellectual structure (together with space and number) within which events must be sequenced, quantify the duration of events, quantify the intervals between them, and compare the kinematics of objects.

The automotive industry today implements features in such a way that all aspects are contained within the system (federated) and therefore reasonably controlled. Sharing information like target reports with other features is anticipated and desired; however measurements reported with respect to the integrated system will be historical in nature and received asynchronously. Timing errors can induce more error in the system than a bad measurement. These and other issues can be addressed with the introduction of a suite of modeling tools based on re-thinking the approach of federated systems and focusing on an integrated systems solution based on state estimation.

Central to the successful implementation of the advanced safety systems discussed above is ensuring ability for the system to cope with and recover from emergency situations. If one or more emergency conditions arise, systems of the future must quickly initiate and successfully execute procedures to mitigate the condition and then recover; these procedures must be performed under tight timing constraints, e.g., pre-crash systems.

This patent describes a system and methods necessary to implement a design methodology that will facilitate and support advanced safety systems design, test, verification, and validation; with emphasis on reliable fault tolerant operation. The implementation of this system and methods is termed "Algorithm Prototyping Analysis and Test" or APAT.

As it stands today, there is much art published documenting the research and development in the area of procedure analysis and design. However, there are no systematic and rigorous methodologies for designing procedures to be used in advanced safety systems for the transportation industry. This is currently viewed as a serious shortcoming, since these high-risk and complex systems employ procedures and action sequences that can and do impact life or death results.

In the future it will be the responsibility of the onboard computers to automatically initiate and execute procedures and recovery sequences. Therefore modeling, analysis, verification, and design of these highly critical methods, procedures and recovery sequences are required and are thus the focus of this patent.

In a discussion of Prior Art, U.S. Pat. No. 7,006,950, Statistical Modeling and Performance Characterization of a Real-time Dual Camera Surveillance System, Greiffenhagen, et al.; the invention relates to a method for visually detecting and tracking an object through a space. The method derives statistical models for errors, including quantifying an indexing step performed by an indexing module, and tuning system parameters. Further the method applies a likelihood model for candidate hypothesis evaluation and object parameters estimation for locating the object. This invention relates specifically to computer vision systems, more particularly to a system having computationally efficient real-time object detection, tracking, and zooming capabilities. The need arises for methods of modeling more than 1 data source against features that require an infinitely variable combination of instruments and measurements.

In a discussion of Prior Art, U.S. Pat. No. 6,028,548, Vehicle Collision Radar with Randomized FSK Waveform, Farmer; describes an automotive radar for improved immunity to jamming from other automotive radars utilizing common modeling methods such as Auto Regressive Modeling (ARMA) and Minimum Variance Spectral Estimation which are just two such methods that would be applicable. It is recognized in the art that modeling sequences implemented as tools or embedded systems will yield desired results. As with U.S. Pat. No. 7,006,950, the modeling sequences identified are based on the improvement of federated devices.

In a discussion of Prior Art, U.S. Pat. No. 7,079,993, Automated Generator of Optimal Models for the Statistical Analysis of Data, Stephenson, et al; describes an automated process for producing accurate statistical models from sample data tables designed to solve for optimal parameters of each statistical model considered, computes test statistics and degrees of freedom in the model, and uses these test statistics and degrees of freedom to establish a complete ordering of the statistical models. Stephenson further describes how the process arrives at a statistical model that is highest in the ordering and is thus deemed most suitable to model the sample data table. These techniques are basically described in the general art of data or information fusion and modeling. It would not be obvious that general and well published statistical techniques should be applied to the art of automotive safety systems design.

Therefore, a need exists for a system and method for modeling sensor system inputs in a synthetic environment against truth tables to achieve optimal performance and cost parameters for the design and implementation of advanced automotive safety systems.

SUMMARY OF THE INVENTION

Although the best understanding of the present invention will be had from a through reading of the specification and claims presented below, this summary is provided in order to acquaint the reader with some of the new and useful features of the present invention. Of course, this summary is not intended to be a complete litany of all of the features of the present invention, nor is it intended in any way to limit the breadth of the claims, which are presented at the end of the detailed description of this application.

In the preferred embodiment, a system and methods are disclosed for providing an Algorithm Prototyping, Analysis and Test (APAT) through an integrated framework for dynamic data modeling and application development. The system provides a data model that first extends the capabilities of the physical data model and then translates, gates, optimizes, fuses, filters and manages the physical representation of the logical model into a state estimation of the situation around the vehicle; this is known as Situation Awareness (SA); the implementation of this core is called SACore (Situation Awareness Core). And because the application framework is integrated with SACore, once the user configures the data model, the features and benefits of the application framework become automatically available to the developer as part of the decision process for cost-performance optimization.

The data-modeling framework of APAT enables a user to define a data model or version of SACore by using a series of graphical user interfaces (GUI). APAT and SACore provide functionality that physical databases cannot provide by dynamically translating the asynchronous data generated into a corresponding state estimation. Users can utilize the GUI to modify the data model by adjusting expected error, rate or core operation, and the system output is automatically adjusted to accommodate the changes. The APAT system and methods shields both the application developer and the sensor supplier from the complexities, limitations and costs of single sensor systems.

Therefore methods need to be developed to allow automotive system designers the ability to characterize numerous sensor types and sensor suppliers within a specific type as to the actual capability of the sensor in terms of measured variances in the reports. Second the methods need to allow the designers the freedom to place the sensor on the vehicle with other sensors of like type or different types; these may have coincident, mostly coincident, or non-coincident fields of view. Further these methods need to allow the designer the ability to specify tolerances of the dynamic system, such as target maneuver expectations. It would be desirable to the system designer if methods could be presented that allowed all system variables to be extracted into a single file allowing the designer the flexibility of changing any variable in a complex system of variables and structured filters without the tedious need of hand coding the changes. In an n-scalable system, wherein the number of sensors, and number of sensor reports are variable, the resulting identity matrix or unit matrix of size n is represented by the n-by-n square matrix, where n-by-n matrices are used to represent linear transformations from an n-dimensional vector space to itself. Defining and coding a 2-by 2 square matrix then changing the square matrix to a 3-by-3 or n-by-n is tedious and probably beyond the skill set of the automotive system designer, therefore methods are presented as the objects of the invention that allow rapid prototyping and auto-code generation for the development, modeling, implementation and testing of advanced automotive safety systems.

It is an objective of the invention to describe methods for rapidly defining or redefining an automotive multi-sensor data fusion system comprising at least one of a vehicle, sensors, a system model of expected behaviors of targets with consideration for system variables, system error and measurement tolerances. The underlying system is based on an n-scalable, asynchronous, measurement oriented, measurement to track, variable structure, interacting multiple model estimation filter, utilizing a nearest neighbor joint probabilistic data association filter using optimal routines, with two dynamic switchable data association filters in place of the optimal JPDA using sub-optimal routines including one of cheap JPDA and sub-optimal JPDA; the system is implemented with consideration for out-of-sequence measurements, a track management system and a reporting system based on polar coordinates and a method for executing a debiased conversion, translation and rotation into a uniform Cartesian Coordinate system.

Another object of the invention is to define the modeling framework including identifying the system variables by group, wherein the first group comprises sensor parameters and includes such parameters as the number of sensors in the system; the relationship of the sensor frames to the vehicle reference; the expected report limits; report outputs; 1-sigma covariance terms.

Another object of the invention is to define the second group of modeling variables as the target maneuver accelerations that will be acceptable in measurement reports, wherein the modeling environment is at least two dimensional, and wherein at least three models are anticipated and they comprise near constant velocity, cross range acceleration, and down range acceleration, and the values are in terms of expected acceleration g's of maneuver and these accelerations are introduced into the filter structure as noise values.

Another object of the invention is to describe a method for reducing processing complexity, when desired, by setting the number of filters implemented on any pairings of sensors, by identifying number of possibilities, with subsequent values set as noise for each option chosen.

Another object of the invention is to describe the filter setup comprising at least one of housekeeping in nature; values set that define the function of the model values that set the starting uncertainty covariance terms expected from each sensor with respect to the dimensional states identified which further defined down range and cross range values for position, acceleration and velocity.

Other features of the present invention will be apparent from the accompanying drawings and from the detailed description that follows.

Aspects and applications of the invention presented here are described below in the drawings and detailed description of the invention. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. §112, ¶6. Thus, the use of the words "function," "means" or "step" in the Detailed Description or Description of the Drawings or claims is not intended to somehow indicate a desire to invoke the special provisions of 35 U.S.C. §112, ¶6, to define the invention. To the contrary, if the provisions of 35 U.S.C. §112, ¶6 are sought to be invoked to define the inventions, the claims will specifically and expressly state the exact phrases "means for" or "step for, and will also recite the word "function" (i.e., will state "means for performing the function of "), without also reciting in such phrases any structure, material or act in support of the function. Thus, even when the claims recite a "means for performing the function of . . . " or "step for performing the function of . . . ", if the claims also recite any structure, material or acts in support of that means or step, or that perform the recited function, then it is the clear intention of the inventors not to invoke the provisions of 35 U.S.C. §112, ¶6. Moreover, even if the provisions of 35 U.S.C. §112, ¶6 are invoked to define the claimed inventions, it is intended that the inventions not be limited only to the specific structure, material or acts that are described in the preferred embodiments, but in addition, include any and all structures, materials or acts that perform the claimed function as described in alternative embodiments or forms of the invention, or that are well known present or later-developed, equivalent structures, material or acts for performing the claimed function.

BRIEF DESCRIPTION OF THE DRAWINGS

A more complete understanding of the present invention may be derived by referring to the detailed description when considered in connection with the following illustrative figures. In the figures, like-reference numbers refer to like-elements or acts throughout the figures.

FIG. 3. Feasible joint association events for FIG. 2

DETAILED DESCRIPTION

In the following description, and for the purposes of explanation, numerous specific details are set forth in order to provide a thorough understanding of the various aspects of the invention. It will be understood, however, by those skilled in the relevant arts, that the present invention may be practiced without these specific details. In other instances, known structures and devices are shown or discussed more generally in order to avoid obscuring the invention. In many cases, a description of the operation is sufficient to enable one to implement the various forms of the invention, particularly when the operation is to be implemented in software. It should be noted that there are many different and alternative configurations, devices and technologies to which the disclosed inventions may be applied. The full scope of the inventions is not limited to the examples that are described below.

In one application of the invention, a system and methods are presented to model fully integrated systems in an Algorithm Prototyping and Analysis and Test tool, hereafter referred to as APAT FIGS. 4-7. APAT models include both the deterministic variety, where the output is a point estimate, and the stochastic type; where some measure of uncertainty characterizes the model outputs whose behavior is non-deterministic in that a state does not fully determine its next state.

Figure 7:
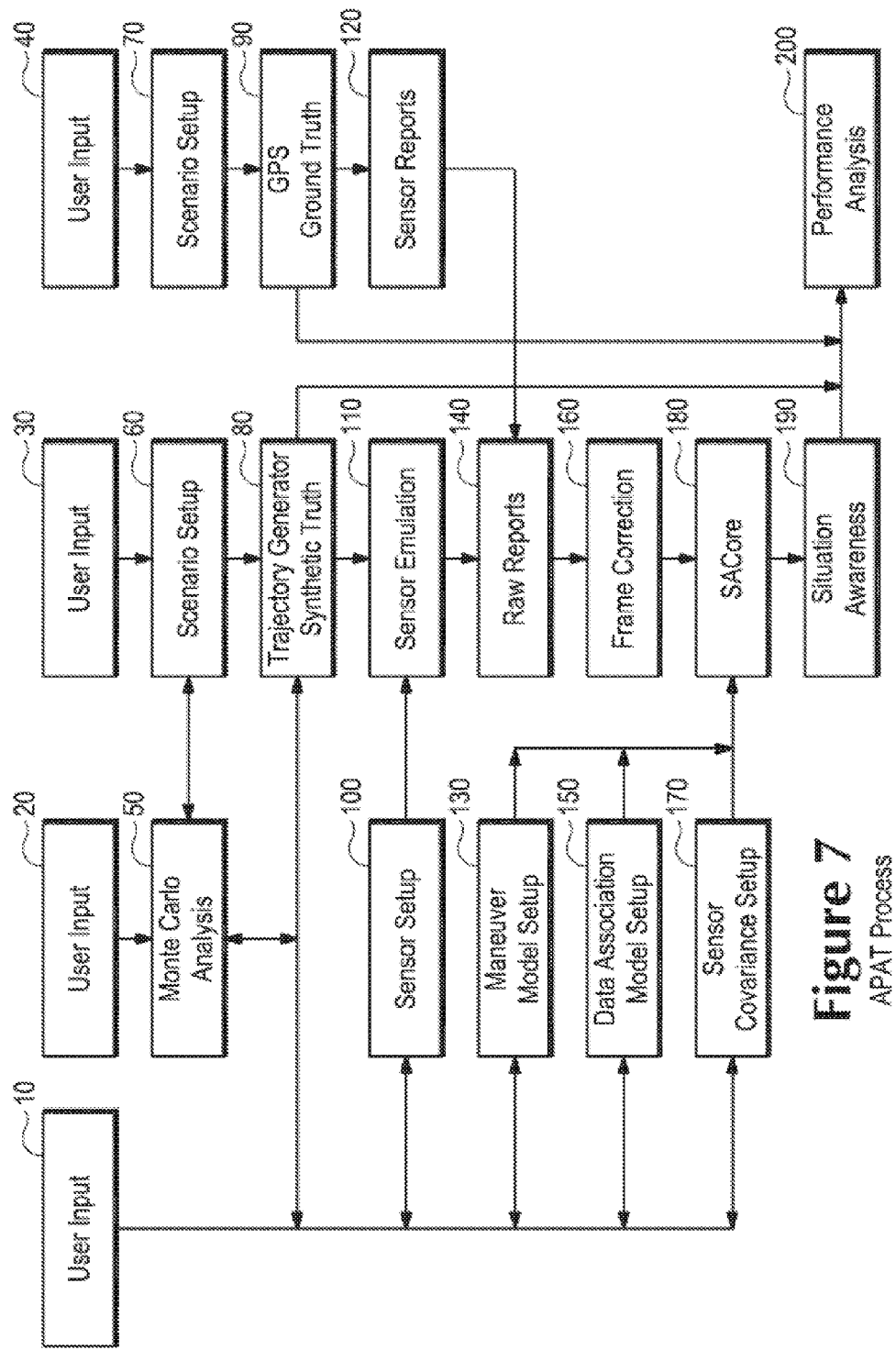
FIG. 7. APAT Process
Figure 8:
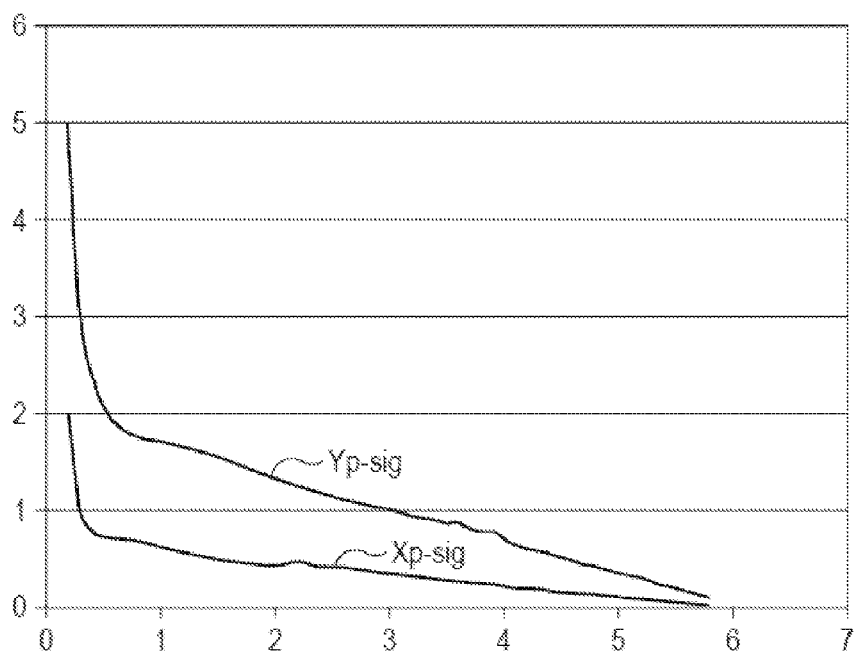
FIG. 8. Radar/Vision—10 Hz/0 Hz CrossRange & Down Range Error
Figure 9:
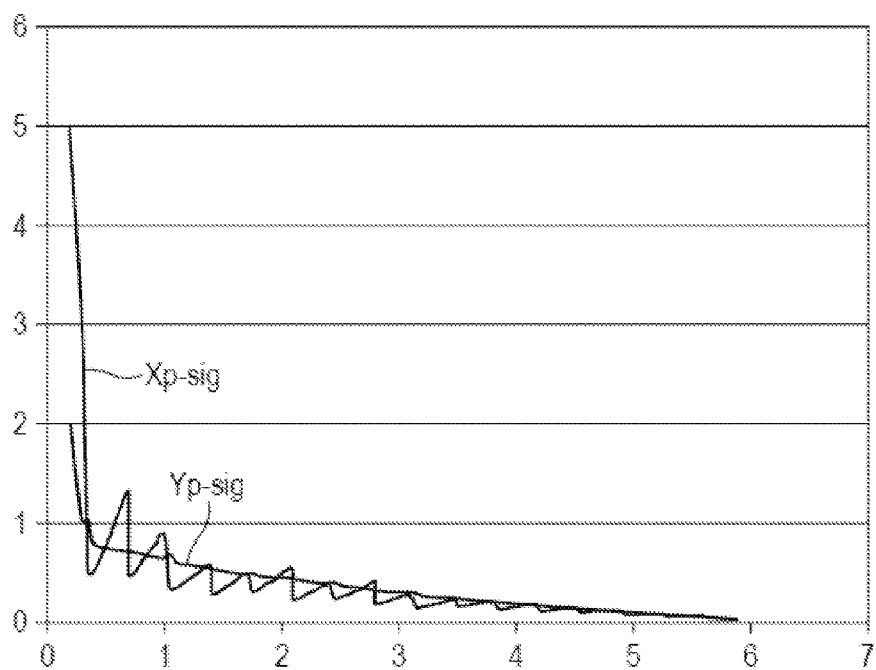
FIG. 9. Radar/Vision—10 Hz/3 Hz CrossRange & Down Range Error
Figure 10:
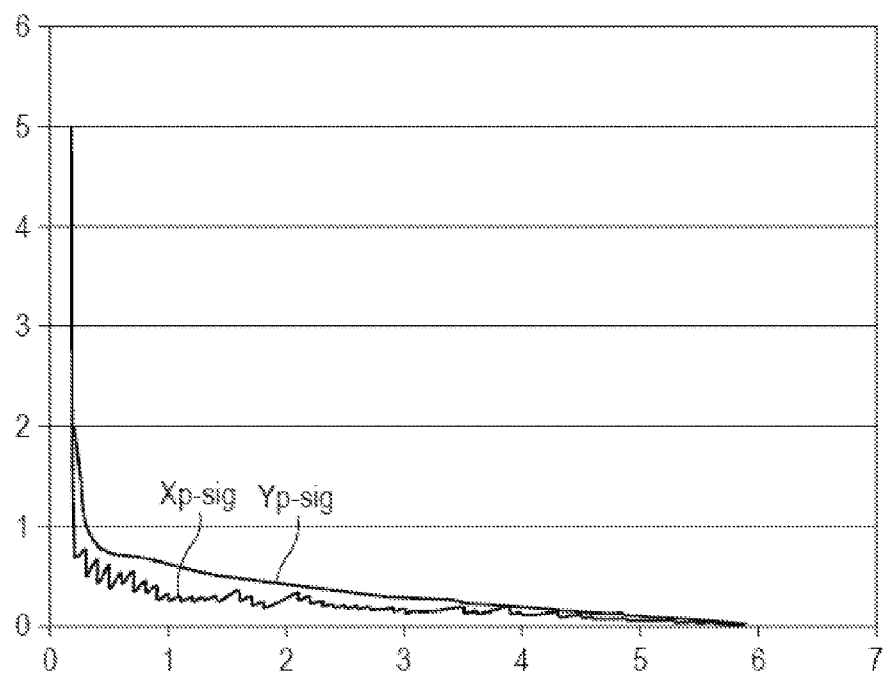
FIG. 10. Radar/Vision—10 Hz/10 Hz CrossRange & Down Range Error
Figure 11:
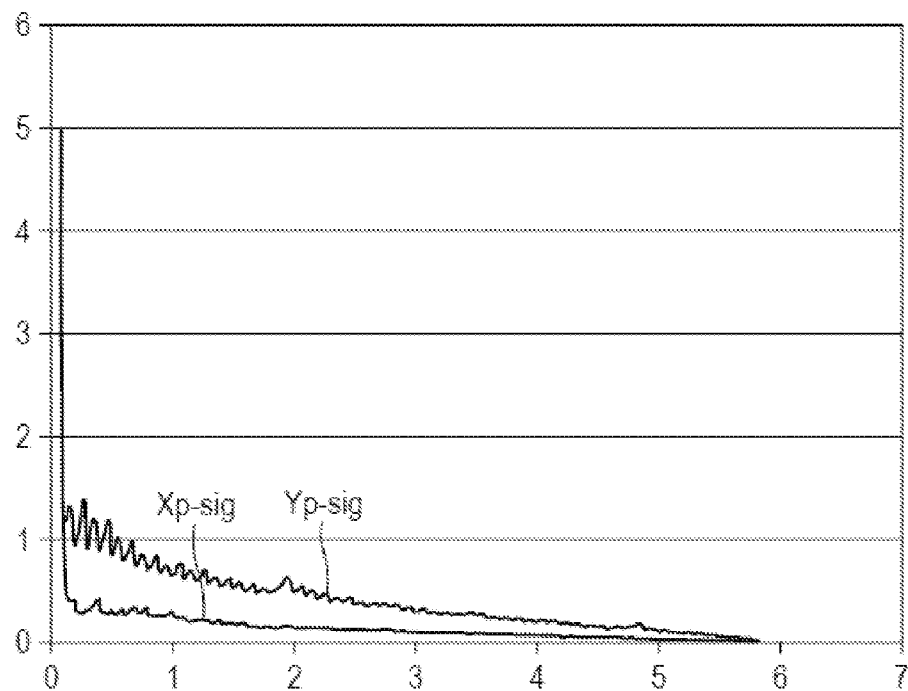
FIG. 11. Radar/Vision—10 Hz/25 Hz CrossRange & Down Range Error
Figure 12:
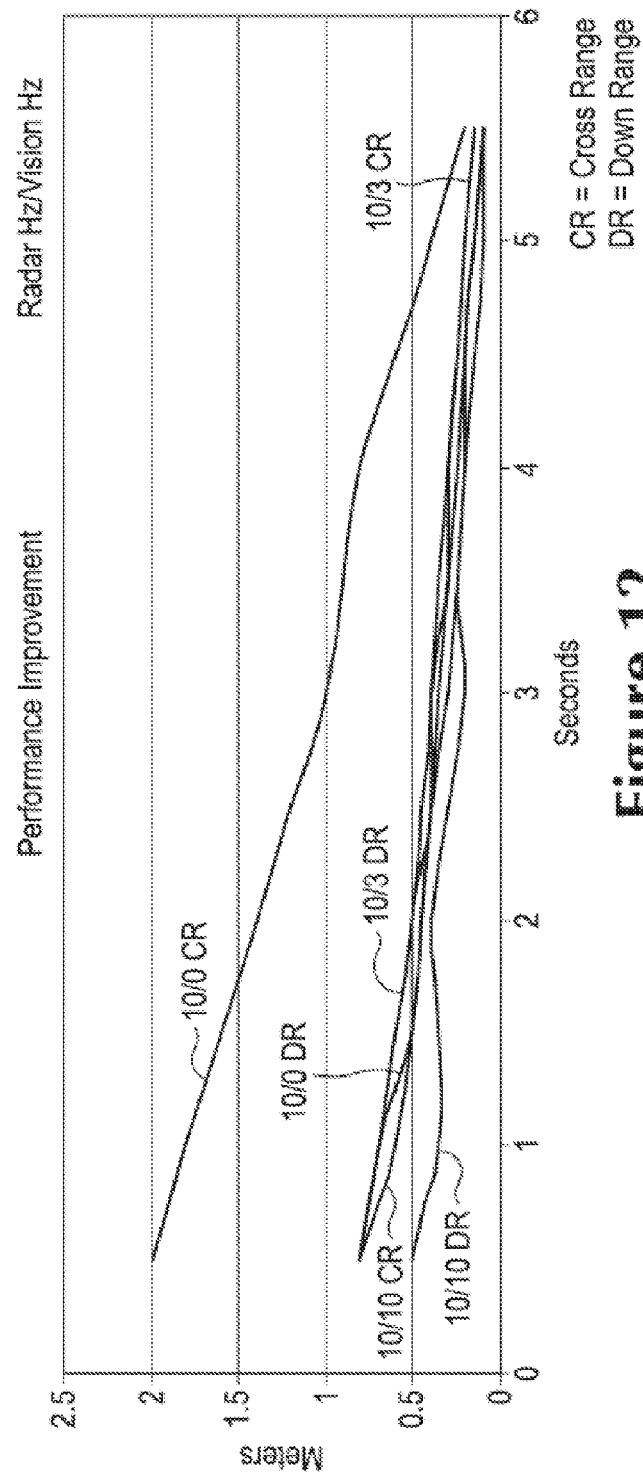
FIG. 12. Performance Improvements Aggregated
Figure 13:
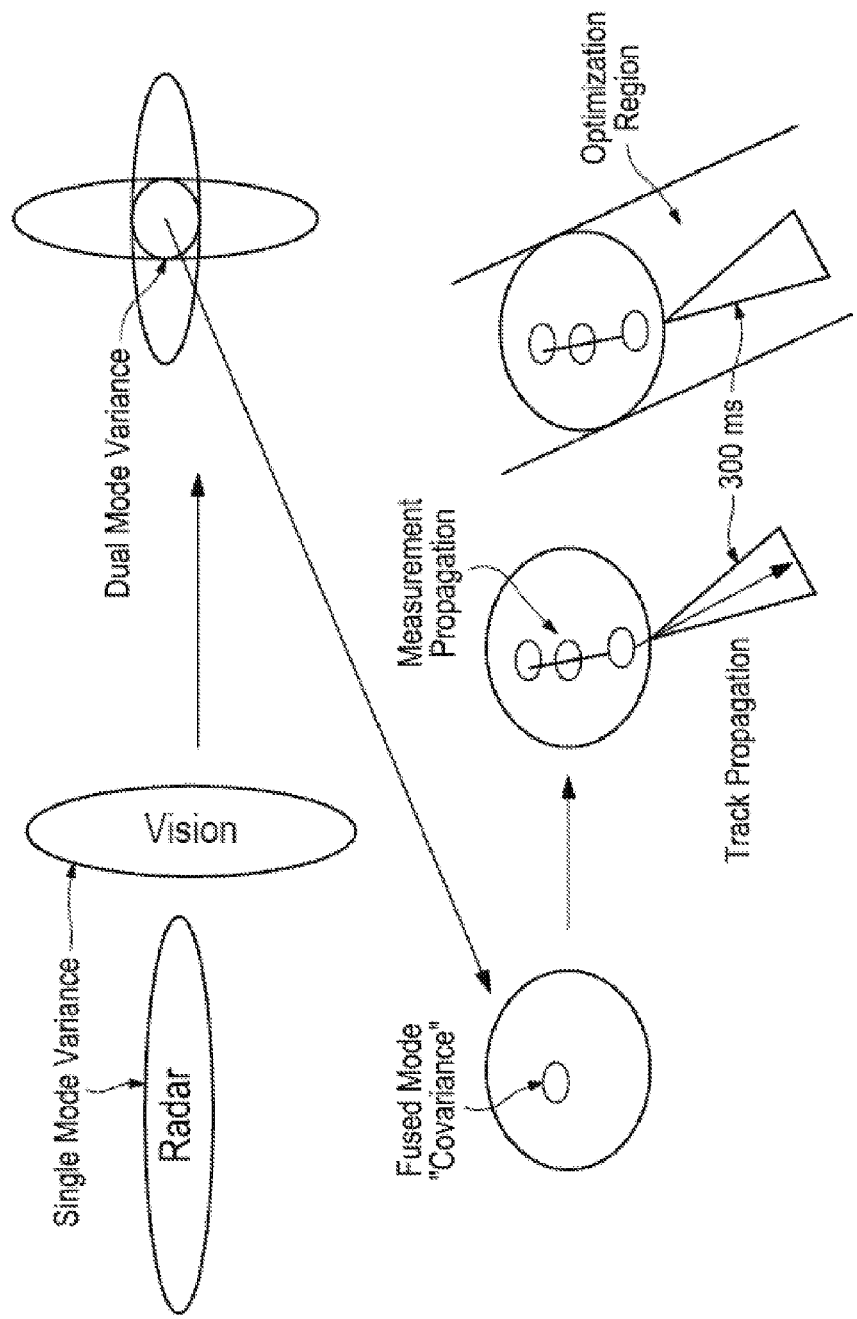
FIG. 13. Performance Improvement
Figure 14:
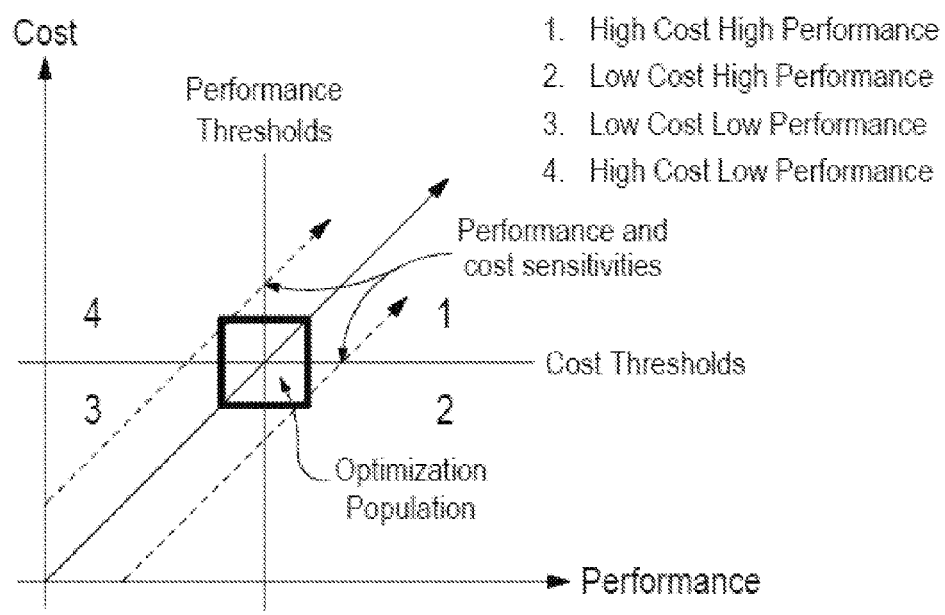
FIG. 14. Performance Optimization

With respect now to FIG. 7. APAT Process, this figure describes the system level implementation APAT. APAT is divided into four main parts;

User Interface (UI) and test setup (10-40; 100, 130, 150, 170);

Target Generation (TG);
    synthetic truth scenarios (60) for the controlled generation of true target trajectories (80); resulting in controlled synthetic sensor reports (110) with no error
    ground truth scenarios (70) for the controlled generation of ground truth target trajectories (90); resulting in controlled ground truth reports with known error Situation Awareness Core (SACore) (180) data aggregation engine (DA)

Performance Analysis (PA) (200) and Monte Carlo Analysis (50)

UI and Test Setup:

Variables that can be set as fusion global parameters as referenced in the text below as <n>:
    <1-25> Set sensor parameters FIG. 7 (100)
    <26-40> Set filter noise values for target maneuver FIG. 7 (130)
    <41-94> Set filter operational parameters FIG. 7 (170)

Begin Variables That Can Be Set . . . <SetFusionGlobals>

1. num_sensors=3;
2. sensor_zaxis=zeros(1,num_sensors); % Z position of sensor(meters) with respect to center of vehicle
3. sensor_xaxis=zeros(1,num_sensors); % X position of sensor(meters) with respect to center of vehicle
4. sensor_xaxis=[0, 0, 0];
5. sensor_yaxis=zeros(1,num_sensors); % Y position of sensor(meters) with respect to center of vehicle
6. sensor_yaxis=[0, 0, 0];
7. sensor_boresight=zeros(1,num_sensors); % Angle of sensor centerline (°) with respect to vehicle X axis
8. sensor_boresight=[0, 0, 0];
9. sensor_boresight_corr=zeros(1,num_sensors); % Boresight correction wrt sensor centerline(degrees)
10. range_max(1)=150;
11. range_max(2)=150;
12. range_max(3)=150;
13. angle_max(1)=20;
14. angle_max(2)=40;
15. angle_max(3)=20;
16. total_sensor_tracks(1)=5; FROM SENSOR
17. total_sensor_tracks(2)=5;
18. total_sensor_tracks(3)=5;
19. angle_sigma_sensor_deg(1)=2.0; COVARIANCE TERMS
20. angle_sigma_sensor_deg(2)=0.25;
21. angle_sigma_sensor_deg(3)=2.0;
22. r_sigma_sensor11=0.005; % range error as a percent of the range for relevant target
23. r_sigma_sensor(1)=0.01; % range error as a percent of the range
24. r_sigma_sensor(2)=0.10; % range error as a percent of the range
25. r_sigma_sensor(3)=0.01; % range error as a percent of the range 26. if filters==1
27. q(1,1)=0.5;
28. q(2,1)=0.5;
29. else if filters==2
30. q(1,1)=0.01;
31. q(1,2)=0.5;
32. q(2,1) =.01;
33. q(2,2)=0.5;
34. else if filters==3
35. q(1,1)=0.01;
36. q(1,2)=0.5;
37. q(1,3)=0.01;
38. q(2,1)=0.01;
39. q(2,2)=0.01;
40. q(2,3)=0.5;
41. deg2rad=pi/180;
42. rad2deg=180/pi;
43. pass_criteria=12;
44. filters=3
45. sensor_measurements=2;2 dim pos
46. rejectmax(1)=3;
47. rejectmax(2)=2;
48. rejectmax(3)=3;
49. newtrack(1)=2;
50. newtrack(2)=2;
51. newtrack(3)=2;
52. states=6;2 DIM OUTPUT, POS/VEL/ACCEL
53. sensor_track_length=14;
54. sensor_raw_number=15;
55. tent_track_length=8;
56. firm_tracks=0;
57. for i=1:num_sensors
58. firm_tracks=firm_tracks+total_sensor_tracks(i);
59. posx_sigma_init_sensor(1)=2.0;STARTING UNCERTAINTY INITIALIZING COVARIANCE TERM
60. posy_sigma_init_sensor(1)=5.0;
61. Rx(1)=posx_sigma_init_sensor(1)*posx_sigma_init_sensor(1);
62. Ry(1)=posy_sigma_init_sensor(1)*posy_sigma_init_sensor(1);
63. velx_sigma_init_sensor(1)=4.0;
64. vely_sigma_init_sensor(1)=4.0;
65. Rvx(1)=velx_sigma_init_sensor(1)*velx_sigma_init_sensor(1);
66. Rvy(1)=vely_sigma_init_sensor(1)*vely_sigma_init_sensor(1);
67. accx_sigma_init_sensor(1)=1.0;
68. accy_sigma_init_sensor(1)=1.0;
69. Rax(1)=accx_sigma_init_sensor(1)*accx_sigma_init_ sensor(1);
70. Ray(1)=accy_sigma_init_sensor(1)*accy_sigma_init_ sensor(1);
71. posx_sigma_init_sensor(2)=5.0;
72. posy_sigma_init_sensor(2)=1.5;
73. Rx(2)=posx_sigma_init_sensor(2)*posx_sigma_init_sensor(2);
74. Ry(2)=posy_sigma_init_sensor(2)*posy_sigma_init_sensor(2);
75. velx_sigma_init_sensor(2)=2.0;
76. vely_sigma_init_sensor(2)=2.0;
77. Rvx(2)=velx_sigma_init_sensor(2)*velx_sigma_init_sensor(2);
78. Rvy(2)=vely_sigma_init_sensor(2)*vely_sigma_init_sensor(2);
79. accx_sigma_init_sensor(2)=1.0;
80. accy_sigma_init_sensor(2)=1.0;
81. Rax(2)=accx_sigma_init_sensor(2)*accx_sigma_init_sensor(2);
82. Ray(2)=accy_sigma_init_sensor(2)*accy_sigma_init_sensor(2);
83. posx_sigma_init_sensor(3)=2.0;
84. posy_sigma_init_sensor(3)=5.0;
85. Rx(3)=posx_sigma_init_sensor(3)*posx_sigma_init_sensor(3);
86. Ry(3)=posy_sigma_init_sensor(3)*posy_sigma_init_sensor(3);
87. velx_sigma_init_sensor(3)=4.0;
88. vely_sigma_init_sensor(3)=4.0;
89. Rvx(3)=velx_sigma_init_sensor(3)*velx_sigma_init_sensor(3);
90. Rvy(3)=vely_sigma_init_sensor(3)*vely_sigma_init_sensor(3);
91. accx_sigma_init_sensor(3)=1.0;
92. accy_sigma_init_sensor(3)=1.0;
93. Rax(3)=accx_sigma_init_sensor(3)*accx_sigma_init_sensor(3);
94. Ray(3)=accy_sigma_init_sensor(3)*accy_sigma_init_sensor(3);
 . . . End of variables that can be set Now with respect to the variables; sensor parameters above are those values (variables) that represent the desired sensor system to be modeled. They include such parameters as the number of sensors in the system <1>; the relationship of the sensor frames to the vehicle reference plane <2-9> for the subsequent translation and rotation of axes; the expected report limits in terms of down range (meters) and cross range (degrees) <10-15>; report outputs from the sensor interface in terms of the number of tracks expected to be report for each sensor <16-18>; 1-sigma (mean of tested actual population with 1 standard deviation) covariance terms for cross range and down range error and linear error expectations <19-25>. The sensor values set in <1-25> can be adjusted during the modeling process for performance optimization and analysis of the output.

As an example <19> sets the sensor 1 covariance term of angular accuracy as ±2° tested and measure over the range of the sensor, the value can be opened to an expected error of ±3° and run again and compared to the first; the value can be closed to an expected error of ±1° and run again and compared to the other two; or the value can be opened to an expected error of ±3° of sensor 1 and closed on sensor 2 <20> to an expected error of ±0.1° and run again and compared. This ability allows the user to choose and model hardware and sensor pairing scenarios against cost and capability at an integrated systems level, this will be discussed further below in the Performance Analysis section.

To those skilled in the art of targeting it is well known that it is impossible to model the absolute expected error of a maneuvering target, therefore an Interacting Multiple Model is implemented as discussed below. As modeling variables that can be set as inputs to the model run are the target maneuver accelerations willing to be accepted in measurement reports. A two dimensional environment is modeled, therefore anticipate three models, near constant velocity; cross range acceleration; and down range acceleration <26-40>. These q values are in terms of g's maneuver and are introduced into the IMM filter structure as noise values. Further, it is desired to not always model the most complex models, therefore the number of filters wished to be implemented can be set on any pairings of sensors, as an example <26, 29, 34> identify the three possibilities, with subsequent values set as noise for each option chosen. For the discussion below, the latter is selected to be described in detail as it represents the most complex case.

Now with respect to the SetFusionGlobals above and the SACore filter setup; the filter setup is identified as items <41-94>; some items are housekeeping in nature <41,42>; items <43-58> are values set as a function of the model described below. Items <59-94 set the starting uncertainty covariance terms expected from each sensor with respect the 2 dimensional states identified in <52> 6 which defined down range and cross range values for position (2), acceleration (2) and velocity (2). As example, <59, 63, 67> set the expected error of the values of sensor 1 in terms of down range/cross range (x/y) position, velocity and acceleration measurements, the cases are:

<59/60>; <2 meters/5 meters>
<63/64>; <4 meters/sec/4 meters/sec>
<67/68>; <1 meter/sec$^2$/1 meter/sec$^2$>

Sensor (2) and sensor (3) are represented in <71-94> in the same manner.

Target Generation (TG)/Simulation

The APAT/SACore state estimation system is based on efficient recursive filter techniques which estimate the state of a dynamic system from a series of incomplete and noisy measurements. As time progresses, a measurement is made and reported. This measurement must be within the expectation of the next measurement. Therefore, the Kalman filter is based on linear dynamical systems discretized in the time domain. They are modeled on a Markov chain built on linear operators perturbed by Gaussian noise. The state of the system is represented as a vector of real numbers. At each discrete time increment, a linear operator is applied to the state to generate the new state, with some noise mixed in, and optionally some information from the controls on the system if they are known. Then, another linear operator mixed with more noise generates the visible outputs from the hidden state. The Kalman filter may be regarded as analogous to the hidden Markov model, with the key difference that the hidden state variables are continuous (as opposed to being discrete in the hidden Markov model). Additionally, the hidden Markov model can represent an arbitrary distribution for the next value of the state variables, in contrast to the Gaussian noise model that is used for the Kalman filter. There is a strong duality between the equations of the Kalman Filter and those of the hidden Markov model. A review of this and other models is given in Roweis and Ghahramani (1999).

In order to use the Kalman filter to estimate the internal state of a process given only a sequence of noisy observations, one must model the process in accordance with the framework of the Kalman filter.

The scenario blocks (60, 70) represent the setup of controlled scenarios for either synthetic or controlled target measurements. These scenarios and trajectories represent absolute (80) or controlled (90) "truth" with respect to position, velocity and acceleration of the host vehicle and targets observed. Scenarios can include any kinematic scenario such as over taking targets, meeting targets, observing target behavior to include spawning and merging targets, etc. Each of the scenarios can further include conditions such as degraded environment, degraded sensor operation, clutter, skipped reports, or any host of non-linear or un-expected errors that can and do occur in the environment. The sensor output blocks FIG. 7 (110) or (120) are fed into the DA through block (140). Additional discussion for blocks (160, 180, 190) are described in the section below. A second file representing target truth are sent to (200) for the analysis of performance. SACore and Tracker FIG. 7. (180)

The instrument measurements are passed to the tracking and data fusion algorithms, which will attempt to produce tracks for each of the targets. Each time a track is altered (update, rate aid, track deletion etc.) it sends a track message to the performance analysis routines, which are used to compile statistics on the performance of the tracking algorithms. This is achieved by comparing the track messages with the target's true position, speed etc.

The SACore is the tracking and fusion filter for integrating multi-sensor data to improve the track file of target vehicles. The problem of accurate reporting of measurements on a target is made more difficult because of the presence of clutter and the fact that the target can maneuver with no prior information. The tracking and sensor data fusion filter consists of four main parts:

Interacting Multiple Model (IMM) Estimation Filter: To estimate the target state, position, velocity and possibly acceleration, a Kalman Filter can be used. The problem is, to accurately estimate the state, the model in the filter must accurately match the maneuvering of the target. Since the movement of the target is not known ahead of time, an accurate model cannot be designed so errors in the state estimation will occur. Adding process noise to model the target maneuvers or using a maneuver detector to adapt the filter has been used in the art, but detection delays and large estimation errors during maneuvers are still a problem. It is generally accepted that the Interacting Multiple Model (IMM) estimator provides superior tracking performance compared to a single Kalman Filter.

The IMM is based on using several models in parallel to estimate the maneuvering target's states. Each Kalman Filter, or another estimation filter, uses a different model for each maneuver, one models a constant velocity target, another models an acceleration in the longitudinal axis while another models an acceleration in the lateral axis. Switching between these models during each sample period is determined probabilistically. Unlike maneuver detection systems where only one filter model is used at a time, the IMM uses all filters. The overall state estimate output is a weighted combination of the estimates from the individual filters. The weighting is based on the likelihood that a filter model is the correct maneuvering target model.

The IMM estimator is a state estimation algorithm that uses Markovian switching coefficients. A system with these coefficients is described by r models, $M^1, M^2, \ldots, M^r$, and given probabilities of switching between these models. The event that model j ($M^j$) is in effect during the sampling period ending at time tk, $(t_{k-1}, t_k]$ will be denoted by $M^j(k)$. The dynamics and measurement for a linear system are given by $$x(k)=\Phi^j(k,k-1)x(k-1)+G^j(k,k-1)w^j(k-1), \quad (1)$$

and $$z(k)=H^j(k)x(k)+v^j(k), \quad (2)$$

where x(k) is the system state at time $t_k$, z(k) is the measurement vector at time $t_k$, $\Phi^j(k,k-1)$ is the state-transition matrix from time $t_{k-1}$ to time $t_k$ for $M^j(k)$, $G^j(k,k-1)$ is the noise input matrix, and $H^j(k)$ is the observation matrix for $M^j(k)$. The process noise vector $w^j(k-1)$ and the measurement noise vector $v^j(k)$ are mutually uncorrelated zero-mean white Gaussian processes with covariance matrices $Q^j(k-1)$ and $R^j(k)$ respectively.

The initial conditions for the system state under each model j are Gaussian random variables with mean $\bar{v}^j(0)$ and covariance $P^j(0)$. These prior statistics are assumed known, as also is $\mu^j(0)=Pr\{M^j(0)\}$, which is the initial probability of model j at $t_0$.

The model switching is governed by a finite-state Markov chain according to the probability $\pi_{ij}=Pr\{M^j(k)|M^i(k-1)\}$ of switching from $M^i(k-1)$ to $M^j(k)$. The model switching probabilities, $\pi_{ij}$, are assumed known and an example is $$\pi_{ij} = \begin{bmatrix} .95 & .05 \\ .05 & .95 \end{bmatrix}. \quad (3)$$

Figure 1:
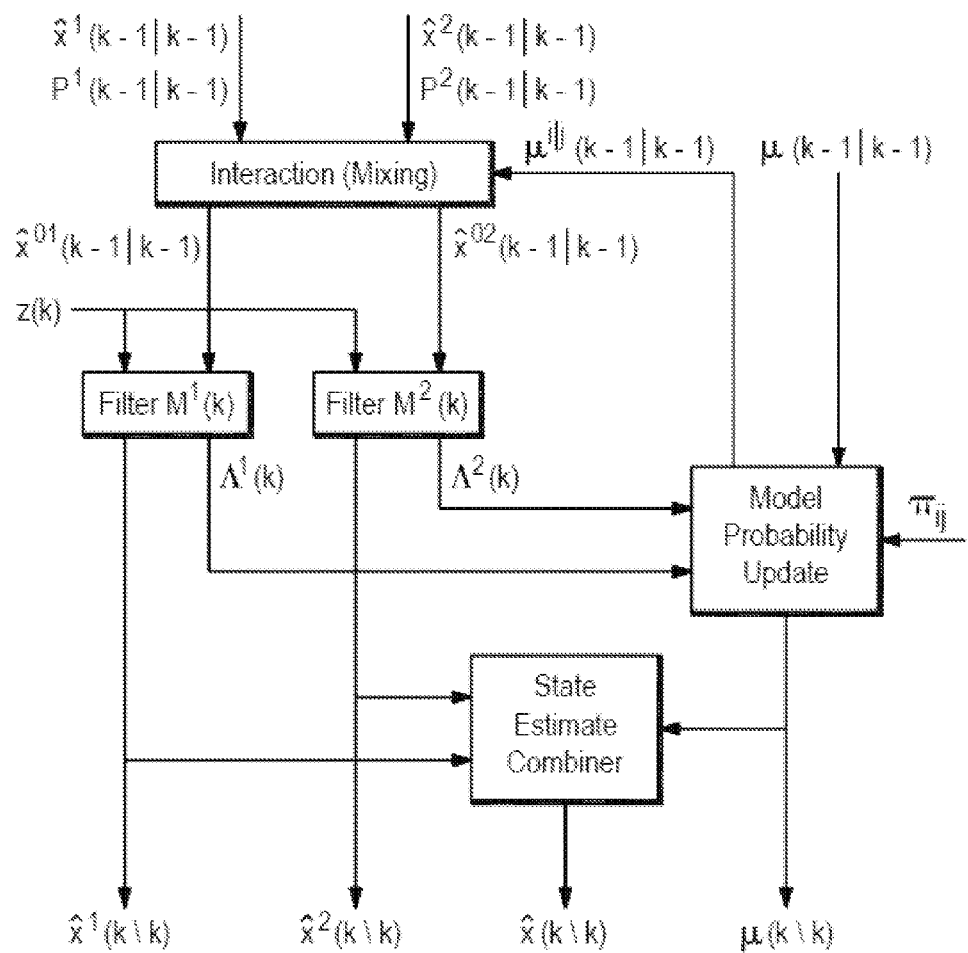
FIG. 1. Block diagram of the IMM for two APAT and SACore models

A block diagram of the IMM estimator with only two models, for simplicity, is shown in FIG. 1.

The inputs to the IMM estimator are $\hat{x}^1(k-1|k-1)$, $\hat{x}^2(k-1|k-1)$, $P^1(k-1|k-1)$, $P^2(k-1|k-1)$, and $\mu^{i|j}(k-1|k-1)$, all from the sampling period ending at $t_{k-1}$. Where $\hat{x}^1(k-1|k-1)$ is the state estimate from filter 1 at time $t_{k-1}$ using measurements from time $t_{k-1}$ and $P^1(k-1|k-1)$ is the corresponding state covariance matrix. Each of the filters use a different mixture of $\hat{x}^1(k-1|k-1)$ and $\hat{x}^2(k-1|k-1)$ for their input. For r models, this mixing allows the model-conditioned estimates in the current cycle to be computed using r filters rather than $r^2$ filters, which greatly decreases the computational burden. The inputs to the filters, $\hat{x}^{01}(k-1|k-1)$, $\hat{x}^{02}(k-1|k-1)$, and the corresponding covariance matrices are computed in the Interaction (Mixing) block. For the filter matched to $M^j(k)$, the inputs are $$\hat{x}^{0j}(k-1|k-1) = \sum_{i=1}^{r} \mu^{i|j}(k-1|k-1)\hat{x}^i(k-1|k-1) \quad (4)$$

$$P^{0j}(k-1|k-1) = \quad (5)$$
$$\sum_{i=1}^{r} \mu^{i|j}(k-1|k-1)\{P^i(k-1|k-1) + [\hat{x}^i(k-1|k-1) - \hat{x}^{0j}(k-1|k-1)] * [\hat{x}^i(k-1|k-1) - \hat{x}^{0j}(k-1|k-1)]^T\},$$

where the conditional model probability is $$\mu^{i|j}(k-1|k-1) = Pr\{M^i(k-1)|M^j(k), Z_1^{k-1}\} \quad (6)$$
$$= \frac{1}{\mu^j(k|k-1)}\pi_{ij}\mu^i(k-1|k-1),$$

and the predicted model probability is $$\mu^j(k|k-1) = Pr\{M^j(k)|Z_1^{k-1}\} = \sum_{i=1}^{r} \pi_{ij}\mu^i(k-1|k-1). \quad (7)$$

Using the measurements, $z(k)$, for the filter matched to $M^j(k)$, the updates are computed using the familiar Kalman Filter equations $$\hat{x}^j(k|k-1)=\Phi(k,k-1)\hat{x}^{0j}(k|k-1), \quad (8)$$

$$P^j(k|k-1)=\Phi^j(k,k-1)P^{0j}(k|k-1)[\Phi^j(k,k-1)]^T + G(k,k-1)Q^j(k-1)[G^j(k,k-1)]^T, \quad (9)$$

$$v^j(k)=z(k)-H^j(k)\hat{x}^j(k|k-1), \quad (10)$$

$$S^j(k)=H^j(k)P^j(k|k-1)[H^j(k)]^T+R^j(k), \quad (11)$$

$$K^j(k)=P^j(k|k-1)[H^j(k)]^T[S^j(k)]^{-1}, \quad (12)$$

$$\hat{x}^j(k|k)=\hat{x}^j(k|k-1)+K^j(k)v^j(k), \quad (13)$$

$$P^j(k|k)=[I-K^j(k)H^j(k)]P^j(k|k-1), \quad (14)$$

where $\hat{x}^j(k|k-1)$ is the predicted state estimate under $M^j(k)$, $P^j(k|k-1)$ is the corresponding prediction covariance, $v^j(k)$ is the residual, $S^j(k)$ is the residual covariance matrix, $K^j(k)$ is the Kalman gain matrix, $\hat{x}^j(k|k)$ is the updated state estimate under $M^j(k)$, and $P^j(k|k)$ is the updated covariance matrix.

The likelihood of the filter matched to $M^j(k)$ is defined by $\Lambda^j(k)=f[z(k)|M^j(k), Z_1^{k-1}]$, where $f[\bullet|\bullet]$ denotes a conditional density. Using the assumption of Gaussian statistics, the filter residual and the residual covariance, the likelihood is $$\Lambda^j(k) = \frac{1}{\sqrt{\det[2\pi S^j(k)]}} \exp\left\{-\frac{1}{2}[v^j(k)]^T[S^j(k)]^{-1}v^j(k)\right\}. \quad (15)$$

The probability for $M^j(k)$ is $$\mu^j(k|k) = Pr\{M^j(k)|Z_1^k\} = \frac{1}{c}\mu^j(k|k-1)\Lambda^j(k), \quad (16)$$

where the normalization factor c is $$c = \sum_{j=1}^{r} \mu^i(k|k-1)\Lambda^i(k). \quad (17)$$

These computations are performed in the Model Probability Update block. Finally the combined state estimate $\hat{x}(k|k)$ and the corresponding state error covariance for the IMM are given by $$\hat{x}(k|k) = \sum_{j=1}^{r} \mu^j(k|k)\hat{x}^j(k|k), \quad (18)$$

$$P(k|k) = \quad (19)$$
$$\sum_{j=1}^{r} \mu^j(k|k)\{P^j(k|k) + [\hat{x}^j(k|k) - \hat{x}(k|k)][\hat{x}^j(k|k) - \hat{x}(k|k)]^T\}.$$

The final state estimate, $\hat{x}(k|k)$, is the best estimate of the target state and $P(k|k)$ is the error covariance matrix for this optimal state estimate.

Nearest Neighbor Joint Probabilistic Data Association Filter: This section deals with the problem of taking a target measurement from a sensor and either associating it to an existing track, possibly rejecting the measurement because it is clutter, or sending it to the track management process to start a new track.

The process is to first define a validation region for each track and to identify all sensor measurements that fall within that region. For the two-dimensional case the validation region for a track is constructed around the predicted measurement for the track. Using the previous track state, the predicted measurement is computed by propagating this state to the time of the next measurement. This predicted measurement is the center of the validation region. If the measurement falls within this validation region, then it is considered as a candidate for association to the track; otherwise, it is rejected.

The predicted measurement $\hat{z}(k|k-1)$ is $$\hat{z}(k|k-1)=H(k)\hat{x}(k|k-1), \tag{20}$$

where $$\hat{x}(k|k-1)=\Phi(k,k-1)\hat{x}(k-1|k-1). \tag{21}$$

The residual, $v(k)$, is the difference between the actual measurement, $z(k)$, and the predicted measurement and is $$v(k)=z(k)-\hat{z}(k|k-1)=z(k)-H(k)\hat{x}(k|k-1). \tag{22}$$

The residual covariance $S(k)$ is $$S(k)=H(k)P(k|k-1)H^T(k)+R(k). \tag{23}$$

The residual statistics are Gaussian with zero-mean and the M-dimensional residual density $f(v(k))$ is $$f(v(k)) = \frac{1}{\sqrt{\det[2\pi S(k)]}} \exp\left\{-\frac{1}{2}d^2\right\}, \tag{24}$$

where the normalized (squared) distance $d^2$ is defined as $$d^2 = v^T(k)S^{-1}(k)v(k) \tag{25}$$

The normalized distance $d^2$ is a chi-square variant, $\chi_M^2$, with M degrees of freedom. A measurement will be in the validation region if $$[\rho-\hat{z}(k|k-1)]^T S^{-1}(k)[\rho-\hat{z}(k|k-1)]\leq g^2, \tag{26}$$

where g is the threshold that insures that the measurement falls in the validation region with a probability of $P_G$. The threshold g is referred to as the number of sigmas or standard deviations for the gate, and g is determined from a $\chi_M^2$ table.

Figure 2:
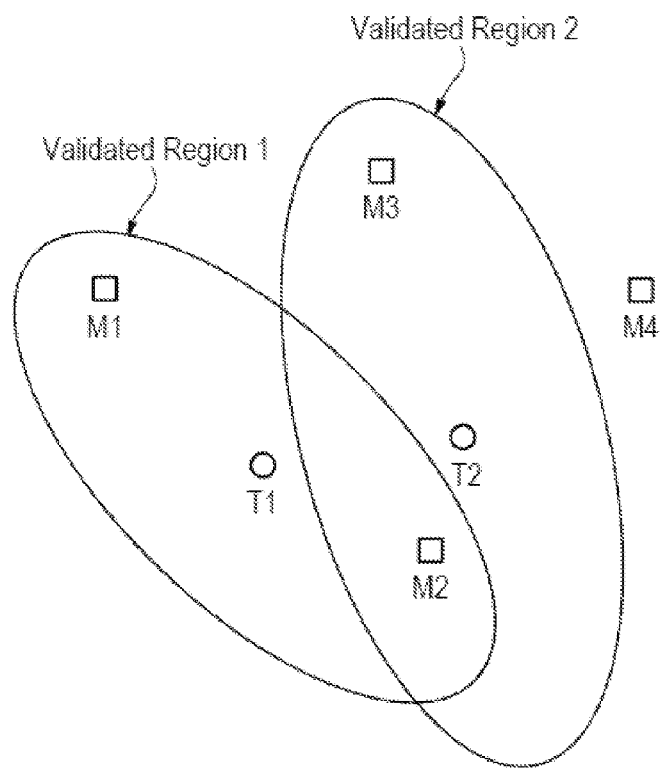
FIG. 2. Validation region for two tracks and five measurements
Figure 4:
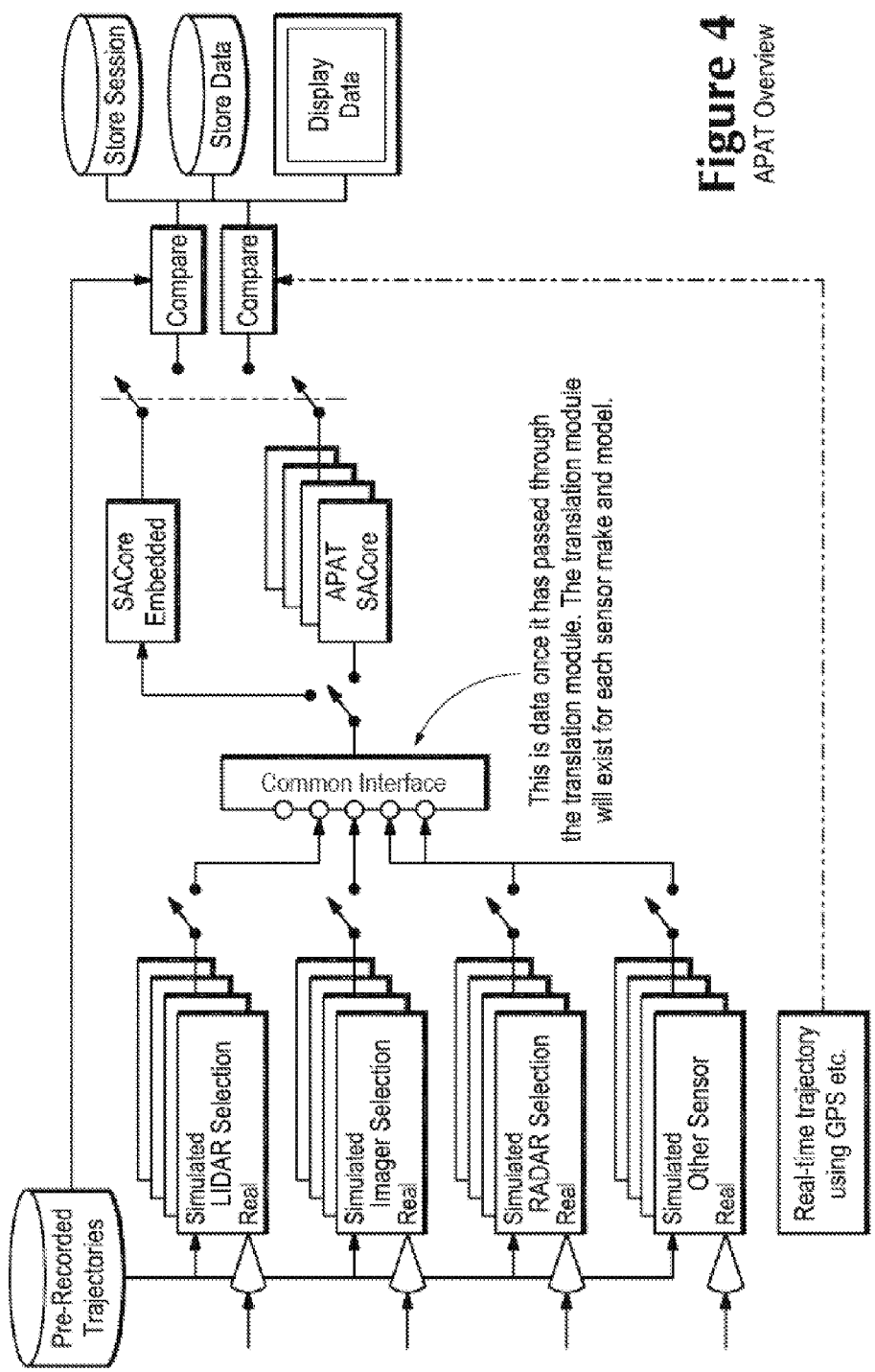
FIG. 4. APAT Overview
Figure 5:
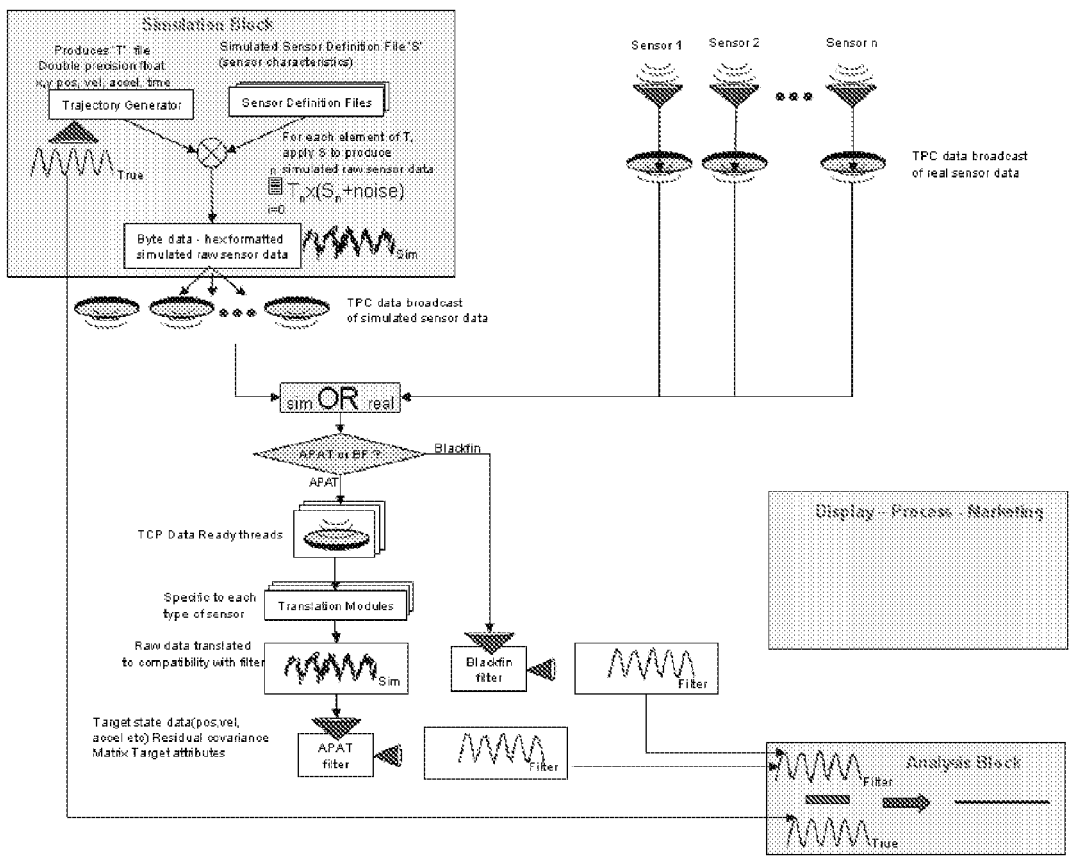
FIG. 5. APAT Model
Figure 6:
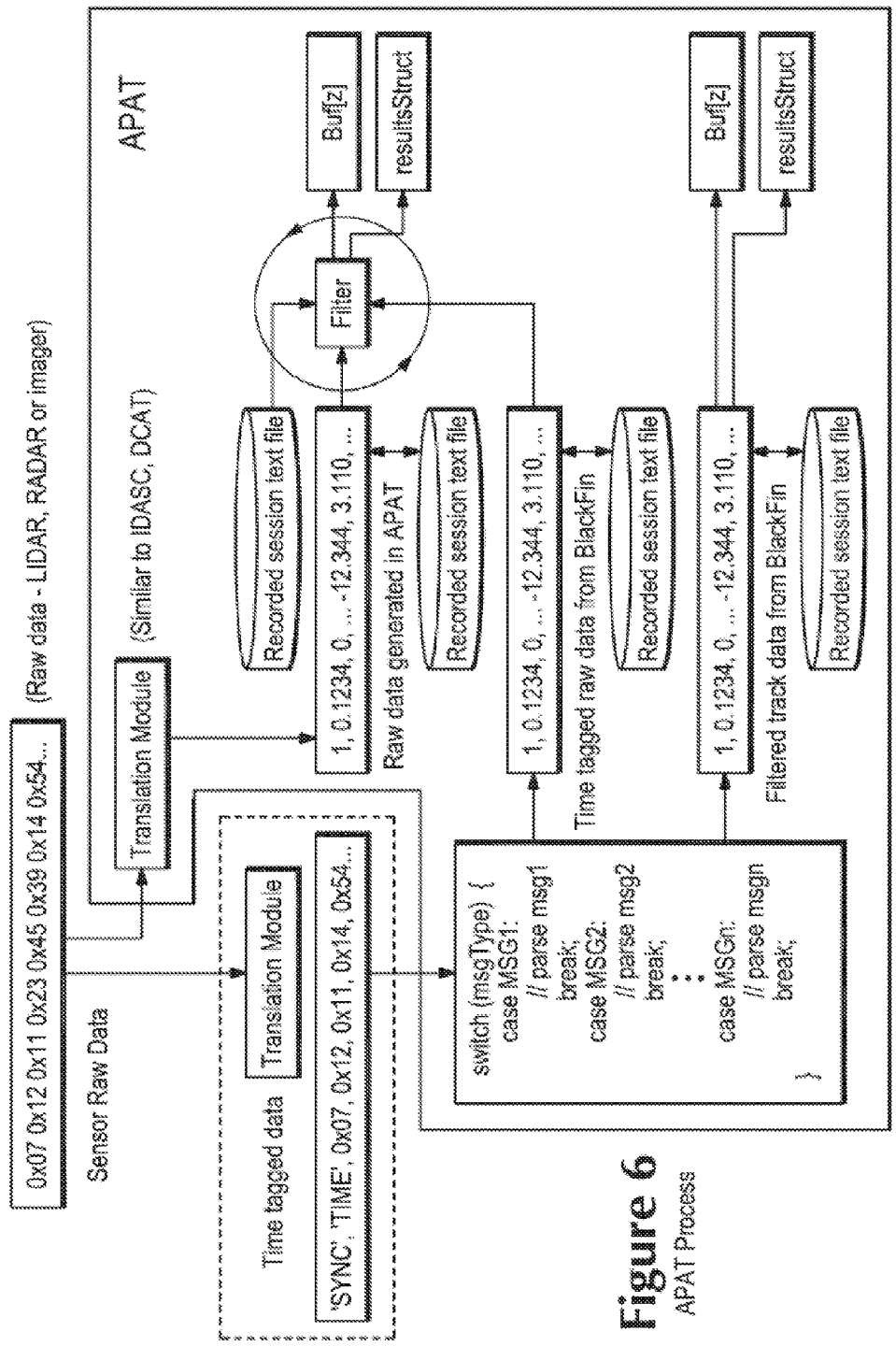
FIG. 6. APAT Process

FIG. 2 shows an example of two elliptical validation regions for a system with two tracks and four measurements. T1 and T2 are the centers of validated regions 1 and 2 respectively and represent the predicted measurements for tracks 1 and 2. Measurements M1 and M2 are valid measurements for track 1 while measurements M2 and M3 are valid measurements for track 2. Measurement M4 is not a valid measurement for either track. In both cases there is more than one measurement valid for each track and a procedure is needed to determine which measurements will be used to update the track state.

To save computation time, a coarse gating procedure of testing individual components of the residual vector may be used using rectangular gates. That is, a measurement $z(k)$ falls inside the coarse gate region provided that $$|z_i(k)-\hat{z}_i(k|k-1)|\leq g\sqrt{S_{ii}(k)}, \tag{27}$$

for each $i=1, \ldots, M$, where $z_i(k)$ and $\hat{z}_i(k|k-1)$ are the $i^{th}$ components of $z(k)$ and $\hat{z}(k|k-1)$, respectively, and $S_{ii}(k)$ is the $i^{th}$ variance in the residual covariance matrix. The rectangular gating eliminates unlikely measurements-to-track pairing and the ellipsoidal gating is used for the measurements that fall in the rectangular gates.

The data association filter that is used for V2.1 is the nearest-neighbor joint probabilistic data association filter (NNJPDAF). To help explain what the NNJPDAF is, the probabilistic data association filter (PDAF) for the single target case will be discussed first. Next the more complex joint probabilistic data association filter (JPDAF), which is used for multiple targets, will be discussed, and then the nearest-neighbor JPDA.

The PDAF is a Bayesian approach that computes the probability that each measurement in a track's validation region is the correct measurement and the probability that none of the validated measurements is the correct measurement. The non-parametric version of the filter will be used since it does not require prior knowledge of the special density of the clutter.

For m measurements falling inside the validation region at time $t_k$, the probability that the $j^{th}$ validated measurement $z_j(k)$ is target originated, denoted $\beta_j$, is $$\beta_j = \frac{e_j}{b+\sum_{i=1}^{m} e_i} (j=1, \ldots, m), \tag{28}$$

while the probability that none of the measurements is target originated, denoted by $\beta_0$, is $$\beta_0 = \frac{b}{b+\sum_{i=1}^{m} e_i}. \tag{29}$$

The term $e_j$ is given by $$e_j = \exp\{-1/2 v_j^T(k)S^{-1}v_j(k)\}, \tag{30}$$

where $v_j(k)$ is the residual for the $j^{th}$ validated measurement and $S(k)$ is the residual covariance for the measurements. The term b is given by $$b = \frac{m}{V}\sqrt{\det[2\pi S(k)]} \frac{1-P_D P_G}{P_D}, \tag{31}$$

where V is the hypervolume of the validated region at $t_k$, $P_D$ is the detection probability (assumed known), and $P_G$ is the probability of the target originated measurement falling inside the validated region (usually set to at least 0.95). The term b accounts for the possibility that none of the validated measurements is target originated and that the target-originated measurement was not detected, or fell outside of the validated region.

The state in the PDAF is updated using all of the measurements and the combined residual $v(k)$ as follows:

$$\hat{x}(k|k)=\hat{x}(k|k-1)+K(k)v(k), \tag{32}$$

$$v(k) = \sum_{j=1}^{m} \beta_j v_j(k), \tag{33}$$

and $v_j(k)$ is the residual for the $j^{th}$ validated measurement, $$v_j(k)=z_j(k)-H(k)\hat{x}(k|k-1). \tag{34}$$

The updated covariance is given by $$P(k|k)=\beta_0 P(k|k-1)+[1-\beta_0]P^c(k)+\tilde{P}(k), \tag{35}$$

where $$P^c(k)=P(k|k-1)-K(k)S(k)K^T(k), \tag{36}$$

and $$\tilde{P}(k) = K(k)\left[\sum_{j=1}^{m} \beta_j v_j(k) v_j^T(k) - v(k)v^T(k)\right] K^T(k). \tag{37}$$

To extend to the multi-target case, the JPDAF is used. First all feasible joint association events $\theta$ in the current scan are determined. A feasible event is a set of non-conflicting validated measurement-to-track pairings in which a measurement can originate from only one source, and at most one measurement can originate from a target. Any number of measurements can originate from clutter. Table 1 lists the eight feasible joint association events θ for FIG. 2. The $\theta_{tj}$'s are the single events making up a joint event θ. $\theta_{tj}$ denotes a single event that measurement j (j=1, . . . , m) originated from target t(t=1, . . . , N), where m is the total number of measurements in the current scan, N is the total number of targets, and t=0 indicates that the measurement is a clutter detection. In the above example m=3 and N=2. For example, the joint event θ=7 is made up of $\theta_{11}$ (T1 originates M1), $\theta_{02}$ (M2 originates from clutter), and $\theta_{23}$ (T2 originates from M3). The binary target detection indicator $\delta_t$ for target t (t=1, . . . , N) has a value of one if a measurement is assigned to target t in θ, and it is zero otherwise. The binary measurement association indicator $\tau_j$ for measurement j has a value of one if measurement j is assigned to a target t (t=1, . . . , N) in θ, and is zero otherwise. The quantity ϕ is the number of measurements originating from clutter in θ.

The joint association event probabilities are given by $$Pr\{\theta | Z_1^k\} = \frac{\gamma(\theta)}{c}, \tag{38}$$

where the normalized constant c is $$c = \sum_\theta \gamma(\theta), \tag{39}$$

where $$\gamma(\theta) = \frac{\phi!}{V^\phi} \prod_{j=1}^m (\Lambda_{t,j})^{\tau_j} \prod_{t=1}^N \{(P_D^t)^{\delta_t}(1 - P_D^t)^{1-\delta_t}\}, \tag{40}$$

and V is the volume of the surveillance region.

The marginal probability of target t (t=0, 1, . . . , N) originating the measurement j, denoted $\beta_{tj}$, is obtained by summing over all feasible joint events θ in which the single event $\theta_{tj}$ occurs, and is given by $$\beta_{tj} = Pr\{\theta_{tj} | Z_1^k\} = \sum_{\theta : \theta_{tj} \in \theta} Pr\{\theta | Z_1^k\}. \tag{41}$$

Once the marginal association probabilities $\beta_{tj}$ are computed, they are used in equations (32) to (37) to update the state for target t.

For the above example, the normalized constant c is the sum of the eight γ's in Table 1 and is given by $$c = P_D^2(\Lambda_{11}\Lambda_{22} + \Lambda_{11}\Lambda_{23} + \Lambda_{12}\Lambda_{23})V + 2!P_D(1-P_D)(\Lambda_{11} + \Lambda_{12} + \Lambda\Lambda_{22} + \Lambda_{23})/V^2 + 3!(1-P_D)^2/V^3 \tag{42}$$

The eight joint association probabilities $Pr\{\theta | Z_1^k\}$ are computed by dividing the γ's in Table 1 by c. The marginal association probabilities, $\beta_{tj}$'s are then computed using equation (41). As an example, the marginal association probabilities for T1 are $$\beta_{11} = Pr\{\theta_{11} | Z_1^k\} = Pr\{\theta = 2 | Z_1^k\} + \tag{43}$$
$$Pr\{\theta = 6 | Z_1^k\} + Pr\{\theta = 7 | Z_1^k\}$$
$$= 1/c\{2!P_D(1-P_D)\Lambda_{11})/V^2 + P_D^2(\Lambda_{11}\Lambda_{22} + \Lambda_{11}\Lambda_{23})V\},$$

$$\beta_{12} = Pr\{\theta_{12} | Z_1^k\} = Pr\{\theta = 3 | Z_1^k\} + Pr\{\theta = 8 | Z_1^k\} \tag{44}$$
$$= 1/c\{2!P_D(1-P_D)\Lambda_{12})/V^2 + P_D^2\Lambda_{12}\Lambda_{23}/V\},$$

$$\beta_{13} = Pr\{\theta_{13} | Z_1^k\} = 0, \tag{45}$$

where $\beta_{13}=0$ because $\theta_{13}$ does not occur in any of the eight joint events θ; that is, M3 is not validated by T1 in FIG. 2. To obtain the probability $\beta_{10}$ of no measurement originating from T1, all joint events in which no measurements are assigned to T1 (i.e., joint events in which $\delta_1=0$) are obtained from Table 1. These joint events are θ=1, 4, 5, so that $$\beta_{10} = Pr\{\theta = 1 | Z_1^k\} + Pr\{\theta = 4 | Z_1^k\} + Pr\{\theta = 5 | Z_1^k\}. \tag{46}$$

Since $\Sigma_j \beta_{tj} = \Sigma_\theta Pr\{\theta | Z_1^k\} = 1$ for each target t, $\beta_{t0}$ can be computed more easily using $$\beta_{t0} = 1 - \sum_{j=1}^m \beta_{tj}. \tag{47}$$

In particular, $\beta_{t0}$ is given by $$\beta_{10} = 1 - (\beta_{11} + \beta_{12} + \beta_{13}). \tag{48}$$

The marginal association probabilities for target T2 can be found in a similar manner.

The technique described above to compute the marginal association probabilities, $\beta_{tj}$'s, can only be used when there are few tracks and/or measurements because of the large amount of computation time required. With large numbers of tracks and measurements, a suboptimal method must be used. Two techniques are described in [1]. They are the Cheap JPDA and the Suboptimal JPDA and both techniques, along with the optimal JPDA, are programmed into this filter version. The choice as to which technique to use can be determined at the beginning of the filter run.

The cheap JPDA was developed by Fitzgerald [4]. The probability $\beta_{tj}$ of track t associating with measurement j is approximated by $$\beta_{tj} = \frac{\Lambda_{tj}}{T_t + M_j - \Lambda_{tj} + B} \tag{49}$$

The quantity $T_t$ is the sum of all likelihoods for target t, which is given by $$T_t = \sum_{j=1}^m \Lambda_{tj} \tag{50}$$

and $M_j$, which is the sum of all likelihoods for measurement j, is $$M_j = \sum_{t=1}^{N} \Lambda_{tj} \tag{51}$$

The quantity B is a bias to account for clutter and for non-unity probability of detection.

Also $$\beta_{t0} = \frac{B}{T_t + B} \tag{52}$$

For the example in FIG. 2, the quantities $M_j$(j=1,2,3) and $T_t$(t=1,2) are given by, $$M_1 = \Lambda_{11} \qquad T_1 = \Lambda_{11} + \Lambda_{12}$$
$$M_2 = \Lambda_{12} + \Lambda_{22} \qquad T_2 = \Lambda_{22} + \Lambda_{23}$$
$$M_3 = \Lambda_{23}$$

The association probabilities for T1 are $$\beta_{10} = \frac{B}{T_1 + B} = \frac{B}{\Lambda_{11} + \Lambda_{12} + B} \tag{54}$$

$$\beta_{11} = \frac{\Lambda_{11}}{T_1 + M_1 - \Lambda_{11} + B} = \frac{\Lambda_{11}}{\Lambda_{11} + \Lambda_{12} + B} \tag{55}$$

$$\beta_{12} = \frac{\Lambda_{12}}{T_1 + M_2 - \Lambda_{12} + B} = \frac{\Lambda_{12}}{\Lambda_{11} + \Lambda_{12} + \Lambda_{22} + B} \tag{56}$$

$$\beta_{13} = \frac{\Lambda_{13}}{T_1 + M_3 - \Lambda_{13} + B} = 0 \tag{57}$$

The association probabilities for T2 can be found in a similar manner. Fitzgerald stated that when clutter was significant, a fixed value of B was adequate. Otherwise he found that a value of B=0 gave satisfactory performance.

Although the cheap JPDA is easy to implement and requires much less computational resources, Roecker and Phillis [2] documented some defects in the cheap JPDA. For example, the association probabilities for a given track may not add up to 1. They showed that this may cause a target track to be drawn off by a nearby target track or a nearby false track. To remove some of these defects, the Suboptimal JPDA was developed by Roecker and Phillis [2].

The concept of partial joint events were introduced by Roecker and Phillis to develop the suboptimal JPDA. A partial joint event considers at most two track-to-measurement pairings. That is, a partial joint event consists of (at most) two single events. Also, it assumes the probability of detection for each track is near unity so that all of the targets are detected and all of the joint events have the same number of measurements assigned to clutter. The computational requirement is more than the cheap JPDA, but less than the optimal JPDA.

The association probabilities in the suboptimal JPDA are computed using the following steps:

1. For each track t, form $A_t$, which is the list of all indices of the validated measurements for track t.
2. For each measurement j, form $C_j$, which is the list of indices of the tracks which validate measurement j.
3. For each track t, form the union of all track index lists from all of the measurements that are validated by track t while excluding the index of track t. This list of track indices, denoted by $L_t$, is given by $$L_t = \bigcup_{j \in A_t} C_j - \{t\}. \tag{58}$$

4. The probability $\beta_{tj}$ of track t associating with measurement j is given by $$\beta_{tj} = \frac{D_{tj}}{B + \sum_{l \in A_t} D_{tl}}, \tag{59}$$

where B is a bias to account for clutter density and $$D_{tj} = \Lambda_{tj} \qquad \text{if } L_t = \phi \tag{60}$$

$$D_{tj} = \Lambda_{tj} \sum_{s \in L_t} N_{sj} \qquad \text{if } L_t \neq \phi$$

where $\Phi$ is the empty set, and $$N_{sj} = \max_{k \in A_s, k \neq j} \{\Lambda_{sk}\}. \tag{61}$$

The probability of no measurements originating from track t is $$\beta_{t0} = \frac{B}{B + \sum_{l \in A_t} D_{tl}}. \tag{62}$$

For the example in FIG. 2, the lists of validated measurements for each track are $A_1$={1,2} and $A_2$={2,3}, and the list of tracks validating each measurement are $C_1$={1}, $C_{21}$={1,2} and $C_{31}$={2}. Here T1, M1, etc, are denoted by 1. The track lists $L_1$ and $L_2$ are $L_1$={2} and $L_2$={1}. The association probabilities for T1 are computed below. A similar procedure can be used to compute the probabilities for T2. The $N_{sj}$'s needed in these computations are obtained using (61).

$$N_{21} = \max_{k \in A_2, k \neq 1} \{\Lambda_{2k}\} = \max\{\Lambda_{22}, \Lambda_{23}\} \tag{63}$$

$$N_{22} = \max_{k \in A_2, k \neq 2} \{\Lambda_{2k}\} = \Lambda_{23} \tag{64}$$

$$N_{23} = \max_{k \in A_2, k \neq 3} \{\Lambda_{2k}\} = \Lambda_{22} \tag{65}$$

Equation (60) is then used to compute the $D_{tj}$'s:

$$D_{11} = \Lambda_{11} \sum_{s \in L_1} N_{s1} = \Lambda_{11} N_{21} = \Lambda_{11} \max\{\Lambda_{22}, \Lambda_{23}\} \tag{66}$$

-continued $$D_{12} = \Lambda_{12} \sum_{s \in L_1} N_{s2} = \Lambda_{12} N_{22} = \Lambda_{12} \Lambda_{23} \quad (67)$$

$$D_{13} = \Lambda_{13} \sum_{s \in L_1} N_{s3} = \Lambda_{13} N_{23} = \Lambda_{13} \Lambda_{22} = 0 \quad (68)$$

Finally, (59) and (62) are used to compute the probabilities for T1:

$$\beta_{10} = \frac{B}{B + \sum_{l \in A_{1t}} D_{1l}} = \frac{B}{\Lambda_{11}\max\{\Lambda_{22}, \Lambda_{23}\} + \Lambda_{12}\Lambda_{23} + B} \quad (69)$$

$$\beta_{11} = \frac{D_{11}}{B + \sum_{l \in A_{1t}} D_{1l}} = \frac{\Lambda_{11}\max\{\Lambda_{22}, \Lambda_{23}\}}{\Lambda_{11}\max\{\Lambda_{22}, \Lambda_{23}\} + \Lambda_{12}\Lambda_{23} + B} \quad (70)$$

$$\beta_{12} = \frac{D_{12}}{B + \sum_{l \in A_{1t}} D_{1l}} = \frac{\Lambda_{12}\Lambda_{23}}{\Lambda_{11}\max\{\Lambda_{22}, \Lambda_{23}\} + \Lambda_{12}\Lambda_{23} + B} \quad (71)$$

$$\beta_{13} = \frac{D_{13}}{B + \sum_{l \in A_{1t}} D_{1l}} = 0. \quad (72)$$

To reduce the number of computations required, the nearest-neighbor JPDAF is used instead of the optimal JPDAF. Instead of using equations (32) to (37) to compute the state estimate and covariance matrix, the NNJPDAF looks for the maximum value of $\beta_{tj}$ for each measurement-track pair. The corresponding measurement is then used to update the corresponding track. If the maximum $\beta_{tj}$ corresponds to track 0, which is clutter, no track is updated. When a track is updated by a measurement, both the track and measurement are no longer used. The procedure is repeated until all associations have been made.

Out-of-Sequence-Measurements (OOSM): It is very possible that when the measurements are received by the filter from multiple sensors that the measurements do not arrive in the proper time sequence. One reason that this may occur is that the time delay in getting the data from different sensors is not the same. Another reason, and it is probably the major one, is that if the sensor process time, time from obtaining the raw data to the time the sensor data is transmitted, is subtracted from the sensor time, lower frequency sensors will appear out of sequence. Subtracting the process time may be necessary to get the actual time the measurement is valid.

The above techniques are valid for measurements that are in sequence. Different techniques can be used to handle the OOSM. One is to hold the sensor measurements in a buffer and when the OOSM arrives then process it and the stored measurements in the proper sequence. The problem with this technique is that the current track data can get old and is not properly updated until the OOSM arrives. Another technique is to run the filter as if there are no OOSMs which will keep the track data current and then if an OOSM arrives, go back to the OOSM's time and reprocess the filter tracks from this time forward using the OOSM and any measurements after the OOSM. The problem with this technique is that a lot of data must be stored so that the filter can be restarted from the OOSM time and it takes a lot of process time. The technique used in this filter is to run the filter normally with all current data measurements and store only the track covariance matrices at each measurement time. Then when an OOSM arrives, propagate the track state and covariance back in time to the OOSM time, verify its association to a track and then perform the update with the OOSM. Next propagate this updated track state and covariance matrix to the current time.

The procedure is described in FIGS. [5], [6] and [7]. The algorithm to compute the current state and covariance terms using the OOSM is divided into seven steps 1. State Retrodiction (propagating the state backwards in time to the OOSM time)
2. Measurement Retrodiction
3. Mode Likelihood Functions
4. Data Association
5. State Update within each Filter Model
6. Update of the Current Mode Probabilities
7. Update of the Current Combined Estimate and Covariance State Retrodiction: The state in each model i of the IMM, i=1, ..., r, is retrodicted to the time $\tau$ of the OOSM, denoted in discrete time as $\kappa$. The time $\tau$ is 1 steps lagged, i.e., $t_{k-l} \leq \tau = t_\kappa < t_{k-l+1}$, where $t_k$ is the current time. The retrodiction of the state $x^i$ of model i to $\kappa$ from k is $$\hat{x}^i(\kappa|k) = F^i(\kappa|k)\hat{x}^i(k|k) \quad (73)$$

where $F^i(\kappa|k)$ is the backward transition matrix of mode i to $\kappa$ from k. The covariances associated with the state retrodiction are calculated as follows. The covariance of the cumulative effect of the process noise to k from $\kappa$ in mode i is $$P_{vv}^i(k,\kappa|k) = Q^i(k,\kappa) \quad (74)$$

For a piecewise constant Wiener process acceleration model, or Discrete Wiener Process Acceleration (DWPA) model, the covariance of the process noise multiplied by the gain matrix $\Gamma$ is $$Q^i(k,\kappa) = \Gamma \tilde{q} \Gamma^T = \begin{bmatrix} \frac{1}{4}T^4 & \frac{1}{2}T^3 & \frac{1}{2}T^2 \\ \frac{1}{2}T^3 & T^2 & T \\ \frac{1}{2}T^2 & T & 1 \end{bmatrix} \sigma_v^2 \quad (75)$$

with $T = t_k - t_\kappa = t_k - \tau$ and $\sigma_v^2$ the covariance of the process noise.

The cross-covariance between the state at k and the process noise to k from $\kappa$ in mode i is $$P_{xv}^i(k,\kappa|k) = Q^i(k,\kappa) - P^i(k|k-1)S^{*i}(k)^{-1}Q^i(k|\kappa) \quad (76)$$

where $$S^{*i}(k)^{-1} = P^i(k|k-1)^{-1} - P^i(k|k-1)^{-1}P^i(k|k)P^i(k|k-1)^{-1} \quad (77)$$

Equation (77) is the key to reducing the 1-step lag OOSM problem to the 1-step lag problem while keeping the solution nearly optimal. $S^{*i}(k)$ is the covariance of the "equivalent measurement" at k that summarizes, for model i, all the measurements from k−l+1 to k. To compute this it is necessary to have stored past state covariances $P^i(k-l|k-1)$ for calculation of $P^i(k|k-1)$ for l up to a maximum delay $l_{max}$. To compute $P^i(k|k-1)$:

$$P^i(k|k-1) = P^i(k|-l) = F^i(k|k-l)P^i(k-l|k-l)F^i(k|k-l)^T + Q(k|k-l) \quad (78)$$

where $F^i(k|k-l)$ is the state transition matrix from k−l to k and $Q(k|k-l)$ is the noise contribution as calculated in (75) with $T = t_k - t_{k-l}$. The covariance for the state retrodiction is $$P^i(\kappa|k) = F^i(\kappa|k)[P^i(k|k) + P_{vv}^i(k,\kappa|k) - P_{xv}^i(k,\kappa|k) - P_{xv}^i(k,\kappa|k)^T]F^i(\kappa,k)^T \quad (79)$$

Measurement Retrodiction: The retrodicted measurement $\hat{z}^i(\kappa|k)$ for filter model i of the IMM estimator is calculated based on (73) for each of the r filter models. The retrodicted OOSM for model i is $$\hat{z}^i(\kappa|k)=H\hat{x}^i(\kappa|k) \quad (80)$$

The corresponding covariance of the innovation is $$S^i(\kappa|k)=HP^i(\kappa|k)H^T+R(\kappa) \quad (81)$$

Mode Likelihood Functions: The likelihood function of each mode at time $\kappa$ is evaluated based on the OOSM and the corresponding retrodiction from the current time. The likelihood function of mode i based on the OOSM from time $\tau$ is $$\Lambda_i(\kappa) = \quad (82)$$
$$|2\pi S^i(\kappa|k)|^{-1/2} \exp\left\{-\frac{1}{2}[z(\kappa)-\hat{z}^i(\kappa)]^T S^i(\kappa|k)^{-1}[z(\kappa)-\hat{z}^i(\kappa|k)]\right\}$$

The resulting vector consisting of all the likelihood functions of the system modes i=1, ..., r in the IMM estimator at time $\kappa$ as $$\Lambda(\kappa)=[\Lambda_1(\kappa),\ldots,\Lambda_r(\kappa)]^T \quad (83)$$

Data Association: To perform the data association for an OOSM, it is required to have the IMM estimator's overall likelihood function at time $\kappa$. For this the mode-conditioned likelihood functions (82) are used, which rely on the mode-conditioned retrodicted measurement and its covariance, and the retrodicted mode probabilities from the current time k to $\kappa$. The mode probabilities at time k (before the OOSM) are given by the vector $$\mu(k|k)=\mu(k|Z^k)=[\mu_1(k|k),\ldots,\mu_r(k|k)]^T \quad (84)$$

where $Z^k$ is the cumulative data at k (not including the OOSM $z(\kappa)$) and $$\mu_i(k|k)=Pr\{M(k)=i|Z^k\} \quad (85)$$

Let $\Pi_{ij}(k_2,k_1)$ be the Markov chain transition probability matrix between the modes to time $t_{k_2}$ from time $t_{k_1}$. The elements of this transition matrix are $$\Pi_{ij}(k_2,k_1)=Pr\{M(k_2)=j|m(k_1)=i\} \quad (86)$$

And the mode probability vector evolves according to $$\mu(k_2|k)=\Pi(k_2,k_1)^T\mu(k_1|k) \quad (87)$$

The transition probability matrix to time $t_{k_2}$ from time $t_{k_1}$ is $$\prod(k_2,k_1) = \frac{1}{\lambda_1+\lambda_2}\begin{bmatrix} \lambda_2+\lambda_1 e^{-(\lambda_1+\lambda_2)T} & \lambda_1-\lambda_1 e^{-(\lambda_1+\lambda_2)T} \\ \lambda_2-\lambda_2 e^{-(\lambda_1+\lambda_2)T} & \lambda_1+\lambda_2 e^{-(\lambda_1+\lambda_2)T} \end{bmatrix} \quad (88)$$

where $T=|t_{k_2}-t_{k_1}|$ and $$\frac{1}{\lambda_1}$$

and $$\frac{1}{\lambda_2}$$

are the sojourn times in modes 1 and 2. Therefore, the retrodicted mode probability vector to $\kappa$ from k is $$\mu(\kappa|k)=\Pi(\kappa|k)^T\mu(k|k) \quad (89)$$

The IMM estimator's overall likelihood function for the OOSM is $$\Lambda_{IMM}(\kappa) = \sum_{i=1}^{r}\Lambda_i(\kappa)\mu_i(\kappa|k) = \Lambda(\kappa)^T\mu(\kappa|k) \quad (90)$$

where $\Lambda_i(\kappa)$ are given in (82) and $\mu_i(\kappa|k)$ follows from (89). This is to be used in the data association to select the delayed measurements to be used in the track update.

State Update within each Filter Model: This shows the update of the state at the current time $t_k$ in each model of the IMM using the selected OOSM. The covariance between the state at k and this measurement is calculated as $$P_{xz}^i(k,\kappa|k)=[P^i(k|k)-P_{xv}^i(k,\kappa|k)]F^i(\kappa|k)^T H^T. \quad (91)$$

The filter gain used for the update is $$W^i(k,\kappa)=P_{xz}^i(k,\kappa|k)S^i(\kappa)^{-1} \quad (92)$$

Then update of the most recent state estimate $\hat{x}(k|k)$ with the OOSM $z(\kappa)$ is given by $$\hat{x}^i(k|Z^k,z(\kappa)) = \hat{x}^i(k|Z^\kappa) = \hat{x}^i(k|\kappa) \quad (93)$$
$$= \hat{x}^i(k|k)+W^i(k,\kappa)[z(\kappa)-\hat{z}^i(\kappa|k)]$$

where the predicted OOSM is given in (80) and the gain is given in (92). The filter-calculated covariance for the updated state estimate is $$P^i(k|\kappa)=P^i(k|k)-P_{xz}^i(k,\kappa|k)S^i(\kappa)^{-1}P_{xz}(k,\kappa|k)^T \quad (94)$$

Update of the Current Mode Probabilities: This shows how the mode probabilities are updated at the current time. The conditional mode probabilities at time k (before the OOSM), given by the vector $$\mu(k|k)=[\mu_1(k|k),\ldots,\mu_r(k|k)]^T \quad (95)$$

are to be updated with the OOSM into $$\mu(k|\Lambda)=[\mu_1(k|\kappa),\ldots,\mu_r(k|\kappa)]^T \quad (96)$$

according to $$\mu_i(k|\kappa) = \frac{1}{c}\left[\sum_{j=1}^{r}\Lambda_j(\kappa)\prod_{ij}(\kappa,k)\right]\mu_i(k|k) \quad (97)$$

where the normalized constant is $$c = \sum_{i=1}^{r}\sum_{j=1}^{r}\Lambda_j(\kappa)\prod_{ij}(\kappa,k)\mu_l(k|k). \quad (98)$$

Update of the Current Combined Estimate and Covariance: Finally the new combined estimate, after the OOSM, is $$\hat{x}(k\mid\kappa) = \sum_{j=1}^{r} \hat{x}^j(k\mid\kappa)\mu_j(k\mid\kappa) \qquad (99)$$

and its covariance is $$P(k|\kappa)=\Sigma\mu_j(k|\kappa)\{P^j(k|\kappa)+[\hat{x}^j(k|\kappa)-\hat{x}(k|\kappa)]\times[\hat{x}^j(k|\kappa)-\hat{x}(k|\kappa)]^T\} \qquad (100)$$

Track Management: A procedure is needed to determine when to initiate a new track and when to drop a track that is no longer being detected by the sensors. Under normal operations, measurements from the sensors are assigned to tracks and are used to update the tracks. If a new measurement is reported by a sensor and it is not associated to an existing track, it may be used to start a new tentative track.

To become a tentative track a sensor must report the same measurement for X number of consecutive scans. The value of X will be determined from real time tests, but initially it is set to 2. If during the next sensor scan the sensor again reports the measurement for the tentative track, the tentative track now becomes a firm track and can be updated by any sensor measurement. If during the next sensor scan the sensor does not report a measurement that corresponds to the tentative track, the tentative track is dropped.

A new firm track is given the lowest integer that has not already been assigned to a firm track. For example, if there are three firm tracks present that have been assigned numbers 1, 2, and 3 then the next firm track will be assigned number 4. If there are three tracks present and they are assigned numbers 1, 4, and 7 then the next firm track will be assigned number 2.

Another function of the Track Management process is to determine if an existing track should be dropped. The Track Management process keeps track of which sensor updates the firm tracks. If all sensors do not update a firm track for at least Y scans, then the firm track is dropped. The value of Y will be determined from real time tests, but initially it is set to 2 for optical sensors and 3 for ranging sensors. As long as one sensor is updating a firm track it will not be dropped.

Sensor Data Conversion: The sensors usually report their target measurements in a polar reference frame, range and azimuth or bearing. The tracking estimator usually computes its Firm Target File in a Cartesian reference frame because it is easier to understand and visualize. Therefore, the sensor data must be converted to the Cartesian reference frame before it is used by the tracking filter.

The standard conversion from the polar to the Cartesian reference frame is:

$$x_m = r_m \cos\theta_m \text{ and } y_m = r_m \sin\theta_m, \qquad (101)$$

where $r_m$ and $\theta_m$ are the range and bearing, respectively, of the sensor target in the polar reference frame and $x_m$ and $y_m$ are the downrange and cross range coordinates, respectively, in the converted Cartesian reference frame. However, when dealing with the statistics of the measurements, mean and variance, one cannot use the above equations to transform from the polar to the Cartesian frames. The uncertainty in the range and the bearing is not a perfect ellipsoid so there needs to be debiased correction terms subtracted from (101) to get a better value for the downrange and cross range measurements and their variances.

The following equations give the debiased conversion from a polar coordinate frame to a Cartesian reference frame:

$$x^{dc} = r_m \cos\theta_m - E[\tilde{x}|r_m,\theta_m], \qquad (102)$$

$$y^{dc} = r_m \sin\theta_m - E[\tilde{y}|r_m,\theta_m], \qquad (103)$$

where
$x^{dc}$ and $y^{dc}$ are the final downrange and cross range debiased conversion coordinates of the sensor target and $$E[\tilde{x}|r_m,\theta_m] = r_m \cos\theta_m(e^{-\sigma_\theta^2} - e^{-\sigma_\theta^2/2}), \qquad (104)$$

$$E[\tilde{y}|r_m,\theta_m] = r_m \sin\theta_m(e^{-\sigma_\theta^2} - e^{-\sigma_\theta^2/2}). \qquad (105)$$

The covariance matrix, $R_a$, for the downrange and cross range coordinates are $$R_a^{11} = \text{var}(\tilde{x}|r_m,\theta_m) = r_m^2 e^{-2\sigma_\theta^2}[\cos^2\theta_m(\cos h\, 2\sigma_\theta^2 - \cos h\, \sigma_\theta^2) + \sin^2\theta_m(\sin h\, 2\sigma_\theta^2 - \sin h\, \sigma_\theta^2)] + \sigma_r^2 e^{-2\sigma_\theta^2}[\cos^2\theta_m(2\cos h\, 2\sigma_\theta^2 - \cos h\, \sigma_\theta^2) + \sin^2\theta_m(2\sin h\, 2\sigma_\theta^2 - \sin h\, \sigma_\theta^2)], \qquad (106)$$

$$R_a^{22} = \text{var}(\tilde{y}|r_m,\theta_m) = r_m^2 e^{-2\sigma_\theta^2}[\sin^2\theta_m(\cos h\, 2\sigma_\theta^2 - \cos h\, \sigma_\theta^2) + \cos^2\theta_m(\sin h\, 2\sigma_\theta^2 - \sin h\, \sigma_\theta^2)] + \sigma_r^2 e^{-2\sigma_\theta^2}[\sin^2\theta_m(2\cos h\, 2\sigma_\theta^2 - \cos h\, \sigma_\theta^2) + \cos^2\theta_m(2\sin h\, 2\sigma_\theta^2 - \sin h\, \sigma_\theta^2)], \qquad (107)$$

$$R_a^{12} = \text{cov}(\tilde{x},\tilde{y}|r_m,\theta_m) = \sin\theta_m \cos\theta_m e^{-4\sigma_\theta^2}[\sigma_r^2 + (r_m^2 + \sigma_r^2)(1 - e^{\sigma_\theta^2})], \qquad (108)$$

where
$\sigma_r^2$ and $\sigma_\theta^2$ are the variances of the range and bearing, respectively, in the sensor polar reference frame.

Performance Improvement Analysis

Figure 15:
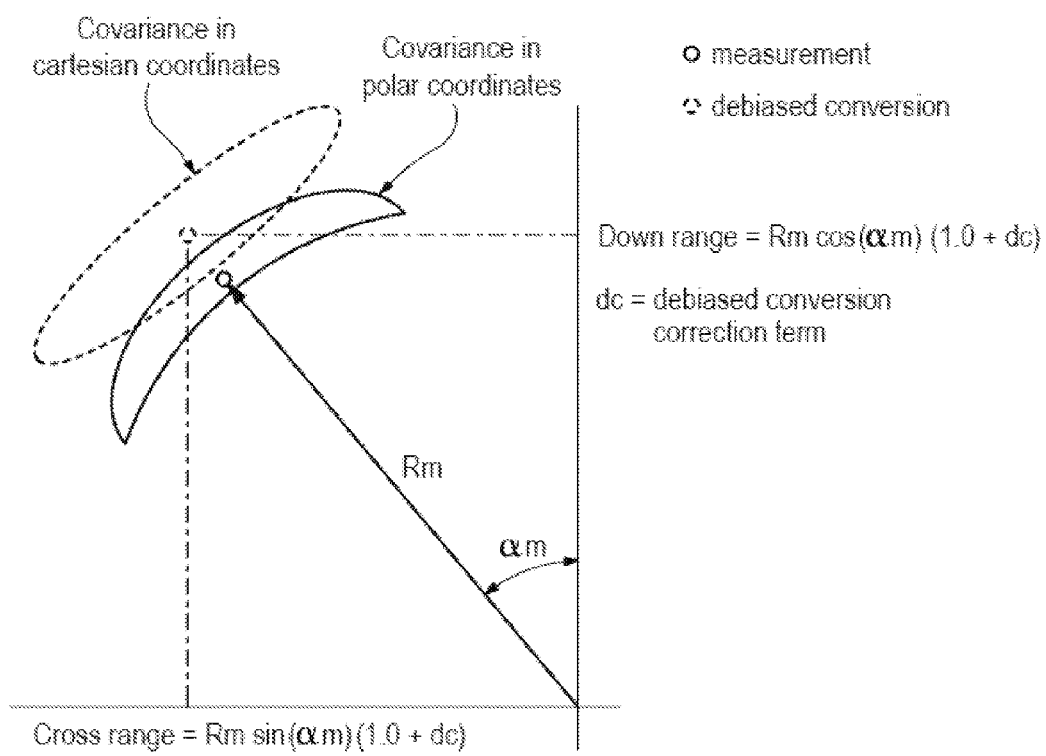
FIG. 15.

FIG. 15. A sensor that provides range, r, and angle, θ, can be converted to the Cartesian coordinates of down range, x, and cross range, y, by using x=r cos(θ) and y=r sin(θ). However, r=rt+re and θ=θt+θe, where rt stands for true range and re stands for the range error. The same applies to the angle. This means that the down range measurement, xm, and the cross range measurement, ym, are as follows:

$$xm = xt + xe = (rt+re)\cos(\theta t+\theta e) \text{ and } ym = yt + ye = (rt+re)\sin(\theta t+\theta e).$$

Expanding these out can give you the error means and covariances, however, it requires knowing the true range, rt, and angle, θt, which are not known. Therefore, the expected values and covariances must be computed based on the measure values of range and angle and not the true values. When this is done the expected value, mean, and covariance of the down range error, xe, and cross range error, ye, give a correction terms for the range and angle terms.

Figure 16:
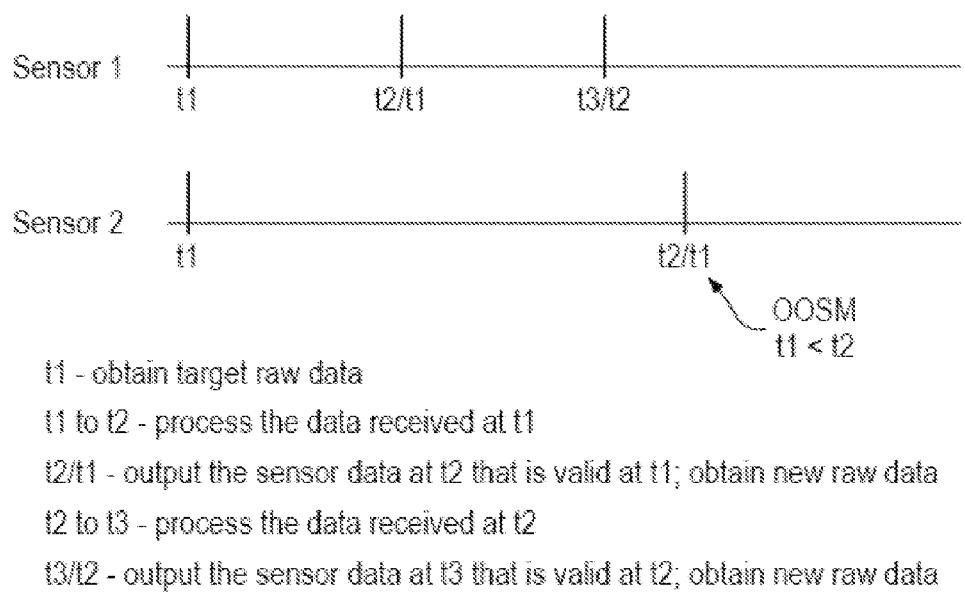

FIG. 16. Assume you have two sensors that take different time intervals to process the raw data. In the slide sensor 1 could be a radar sensor that process the raw data faster and, therefore, has a faster output rate. Sensor 2 could be an optical sensor that takes longer to process the raw data.

Both sensors get the raw data at time t1. Sensor 1 takes the time from t1 to t2 to process its data and then sends it to the filter. Since the process time is known, a time tag can then be applied to the data which was received at t2 with the time t1 which is more accurately the time of the data. For the data received from sensor 1 at t3, the time tag of t2 is given. This is a way to compensate for the sensor latency. Now look at sensor 2 which takes a longer time to process its data than sensor 1. When the data packet arrives at time t2 it is actually given the time stamp of t1 since that more accurately reflects the time of the data. You can see that this will cause a sequence problem if the data rates of the sensors are not the same. Sensor 2's data at its time t2 is tagged as t1 which comes earlier in real time than sensor 1's data at t3 that is tagged as t2. This data is now out of sequence because the filter has processes data from sensor 1 for time t2 and now it gets data from sensor 2 with a time tag of t1. This is where the filter's OOSM (out-of-sequence-measurements) algorithms come into play.

Figure 17:
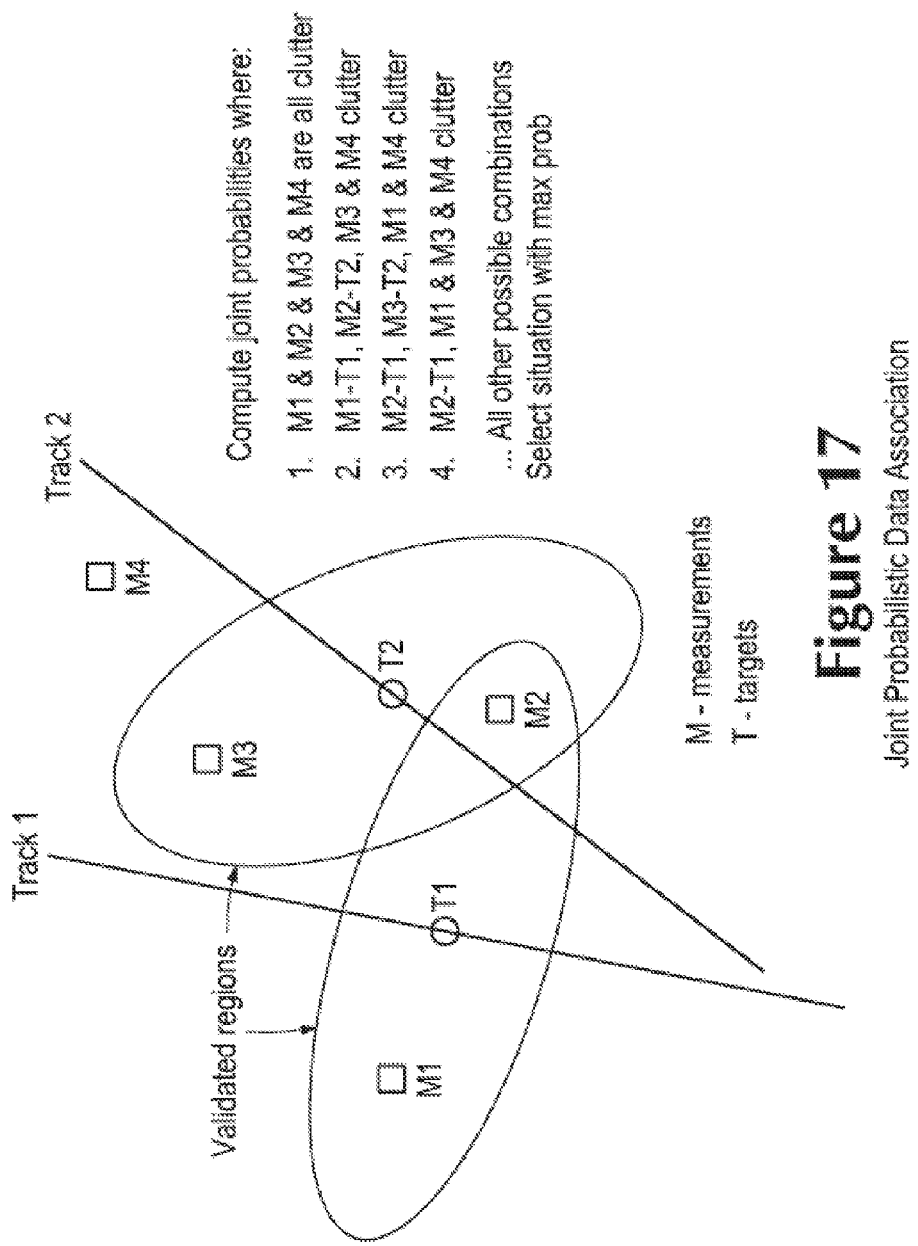

FIG. 17 JPDA is a technique to deal with the problem of taking measurement data and either associating it with an existing track, rejecting it because it may be clutter, or possibly starting a new track. A validation region is generated for each track about the predicted measurement point and all measurements that fall in these regions are considered. The probabilities for all possible combinations of valid measurements to tracks are computed and the highest probabilities are used to match up the measurements and tracks. Presently this approach is used, which is the nearest-neighbor JPDA filter instead of the true optimal JPDA filter which requires more computations.

Figure 18:
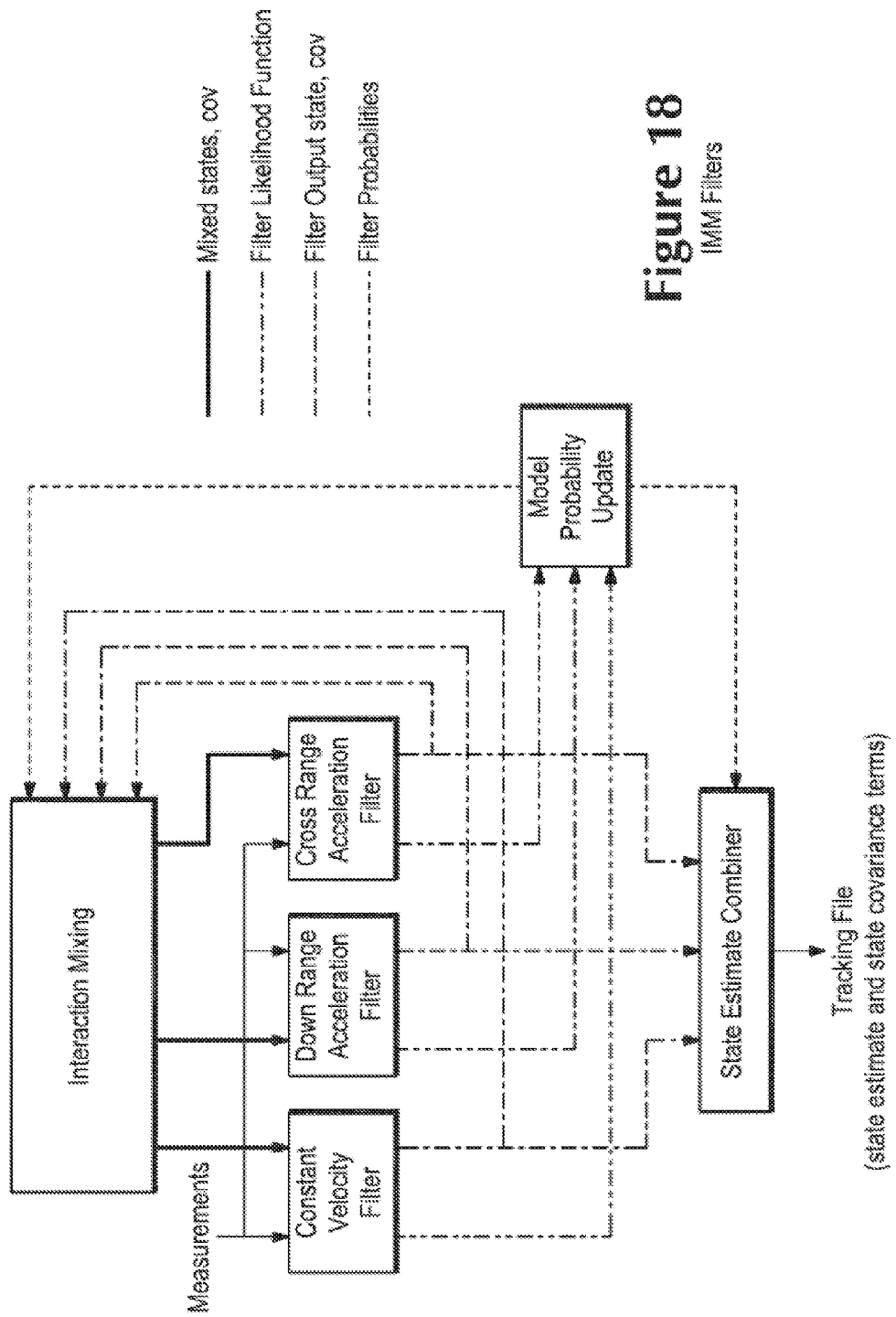

FIG. 18. Instead of one Kalman Filter to estimate the position, velocity and acceleration of the targets, three filters are proposed, a constant velocity filter, down range acceleration filter, and a cross range acceleration filter. All three filters run at the same time and their outputs are weighted based on what the IMM thinks is the best filter for the trajectory. This allows the constant velocity filter to estimate the target trajectory when the target is not accelerating, the down range acceleration filter to estimate the trajectory when the target is accelerating straight ahead, and the cross range filter to estimate the trajectory when the target is in a turn. Since the best filter is operating during its part of the trajectory, the estimate errors are smaller. Also if the target is accelerating straight ahead and turning, then both the down range and cross range filters may be equally heavily weighted.

Figure 19:
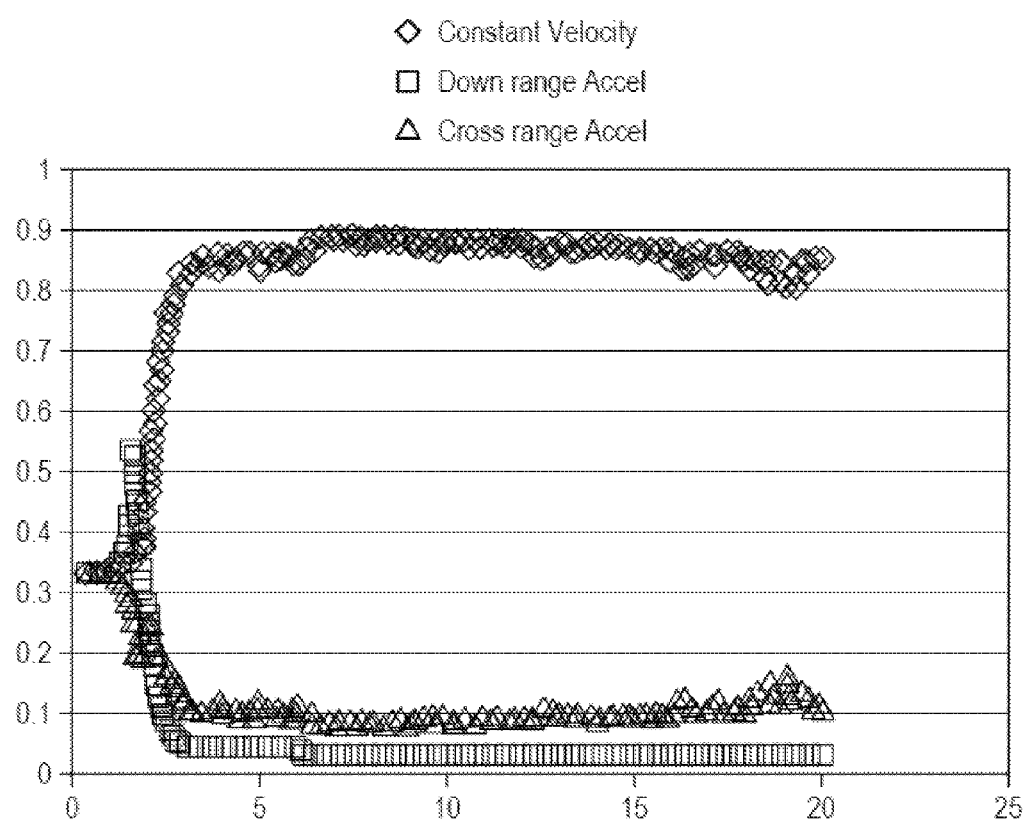

FIG. 19. The IMM filters starts off with all three filters (constant velocity, down range acceleration, and cross range acceleration) weighted equally. The IMM switching soon determines that the target is moving at a constant velocity and weights this filter much heavier than the two acceleration filters.

Figure 20:
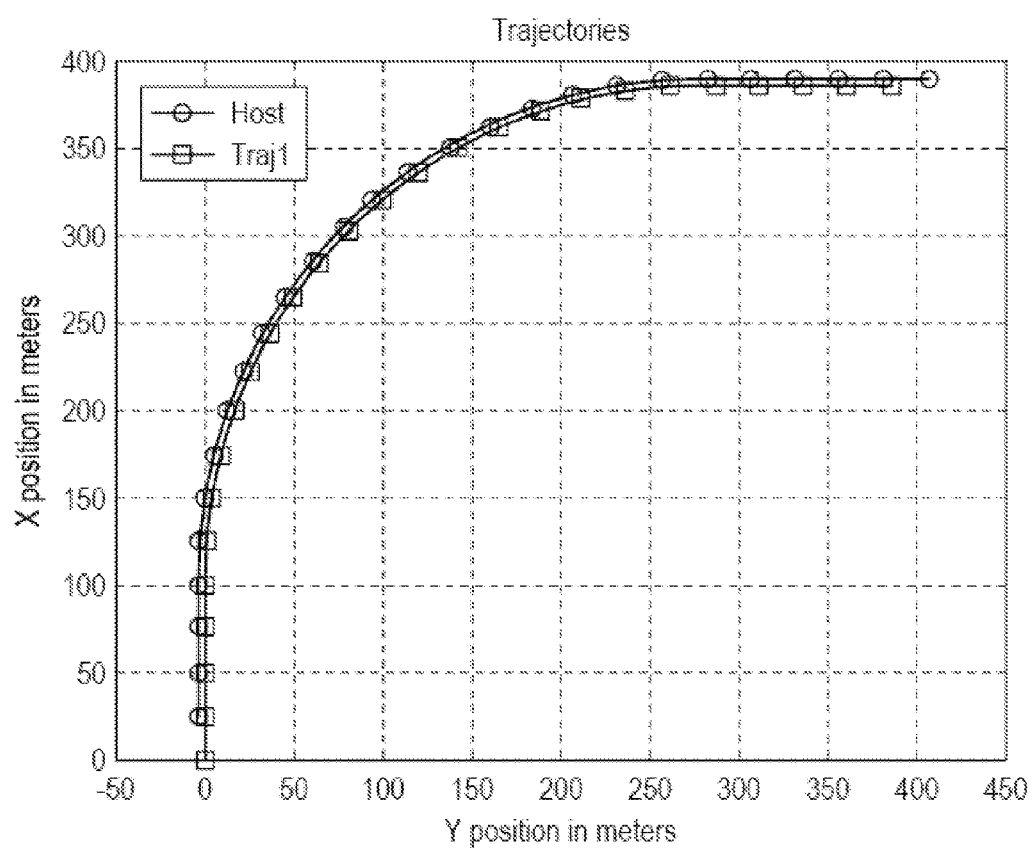

FIG. 20. In this trajectory both vehicles perform a 90 degree constant rate turn to the right. However, the target vehicle is about 25 meters ahead of the host vehicle and one lane to the left so it starts the turn earlier. The start on the plots indicates the starting position.

Figure 21:
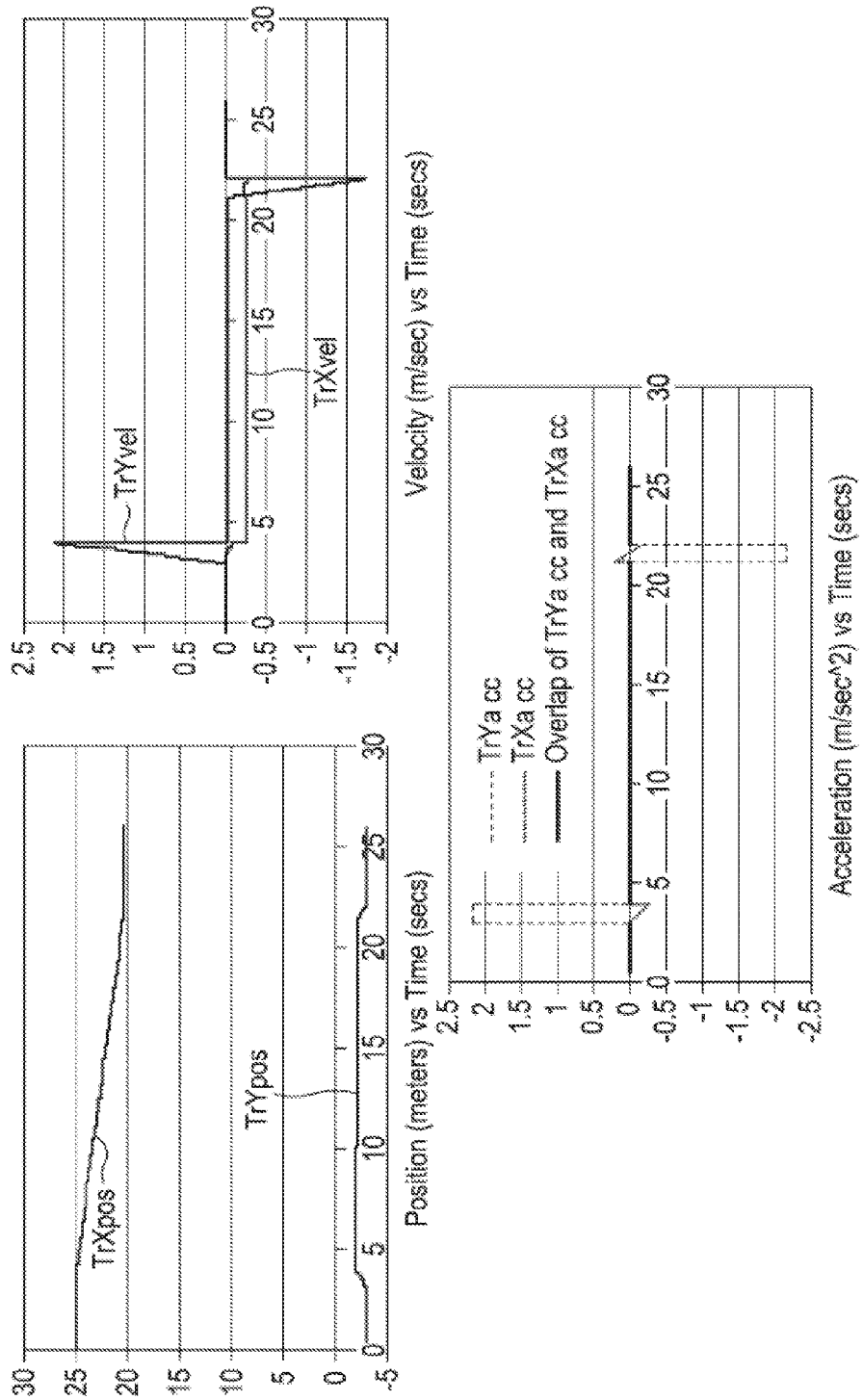

FIG. 21. These show the relative position, velocity and acceleration of the target vehicle to the host vehicle. Note the acceleration curve which shows the lateral acceleration due to the turning of the vehicles. The spikes occur due to one vehicle turning while the other is not.

Figure 22:
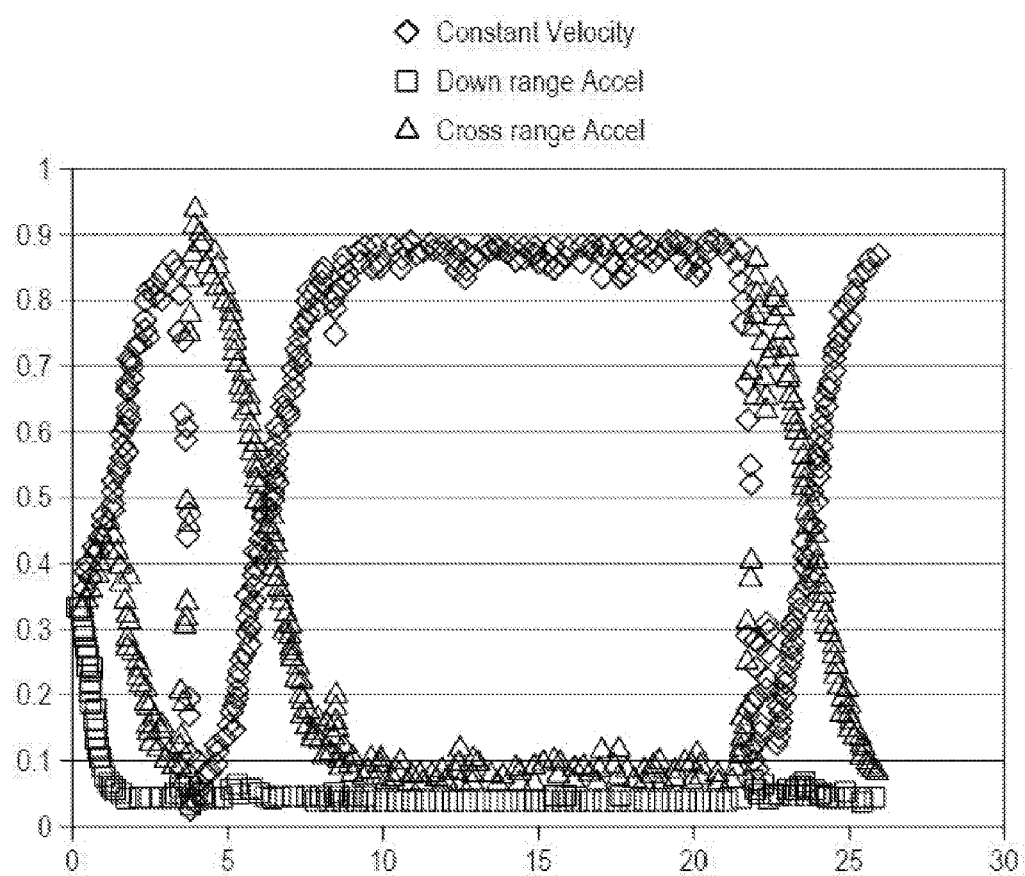

FIG. 22. This shows that again initially the three filters start off equally, but when one vehicle turns and the other does not, the filter that looks for cross range acceleration filter is weighted much heavier during the acceleration spike, but decreases gradually after the spike.

FIG. 23. Typical radar values expected

FIG. 24. Typical maneuver scenario

Figure 25:
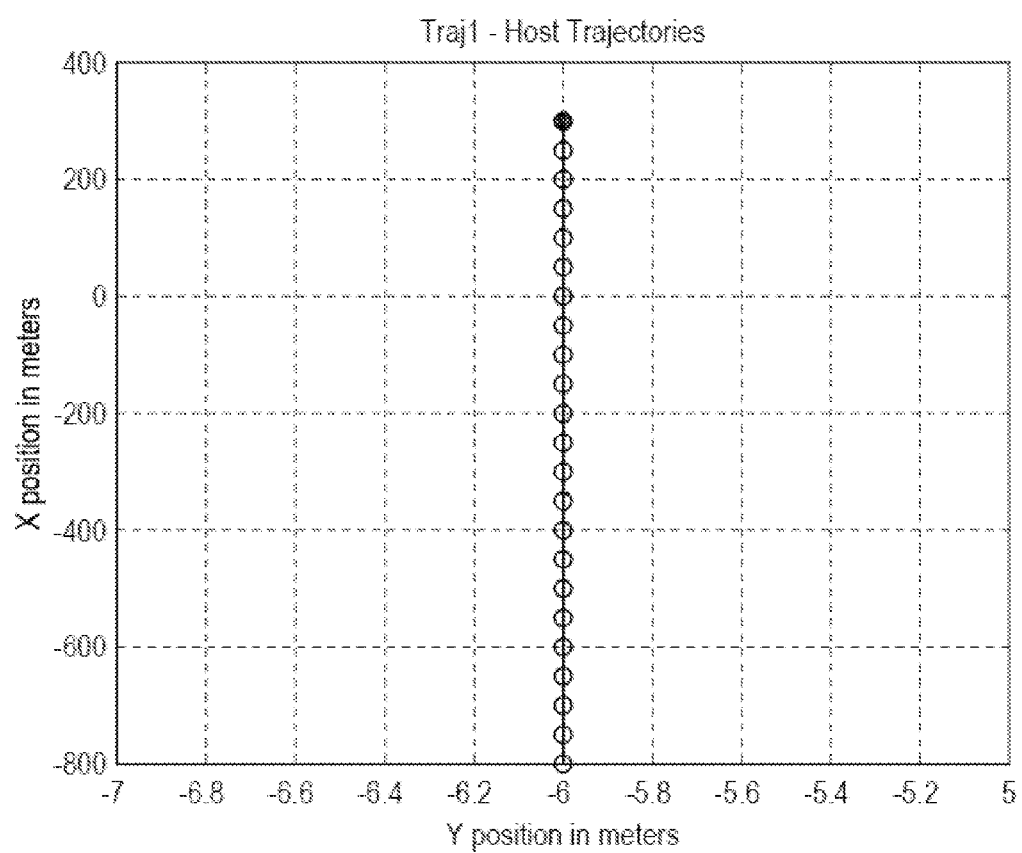

FIG. 25. This shows the relative position of the target vehicle with respect to the host vehicle. The relative velocity is −50 m/sec in the X axis and 0 in the Y axis.

Figure 26:
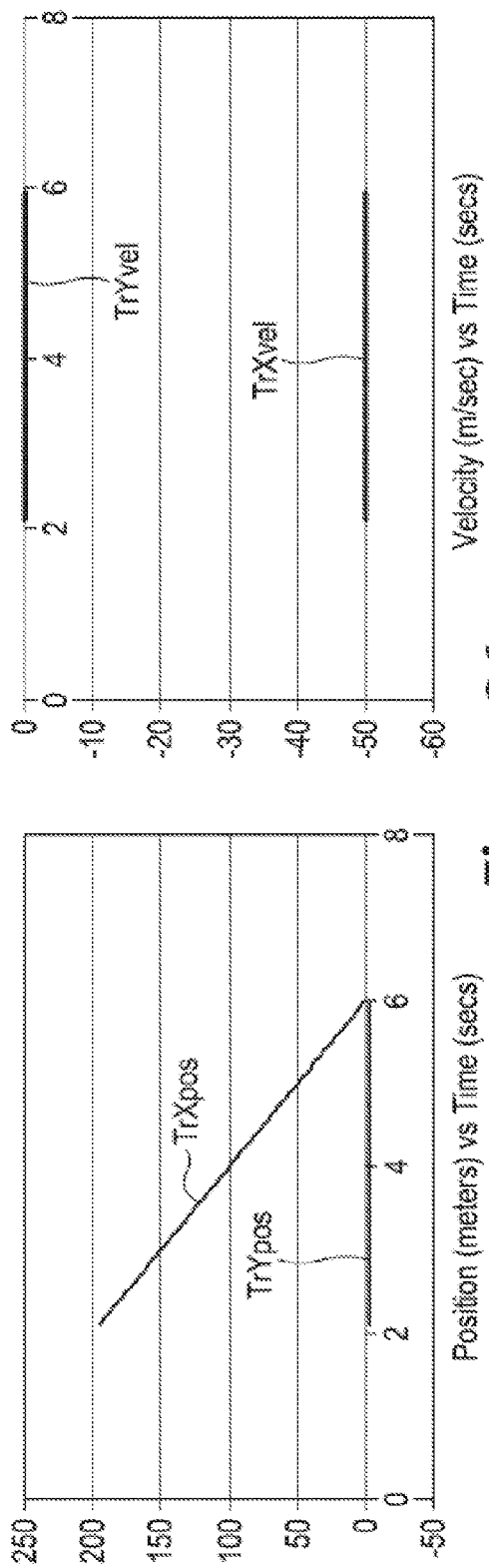

FIG. 26. This shows the relative position and velocity charts for the X (down range) and Y (cross range) axes.

Figure 27:
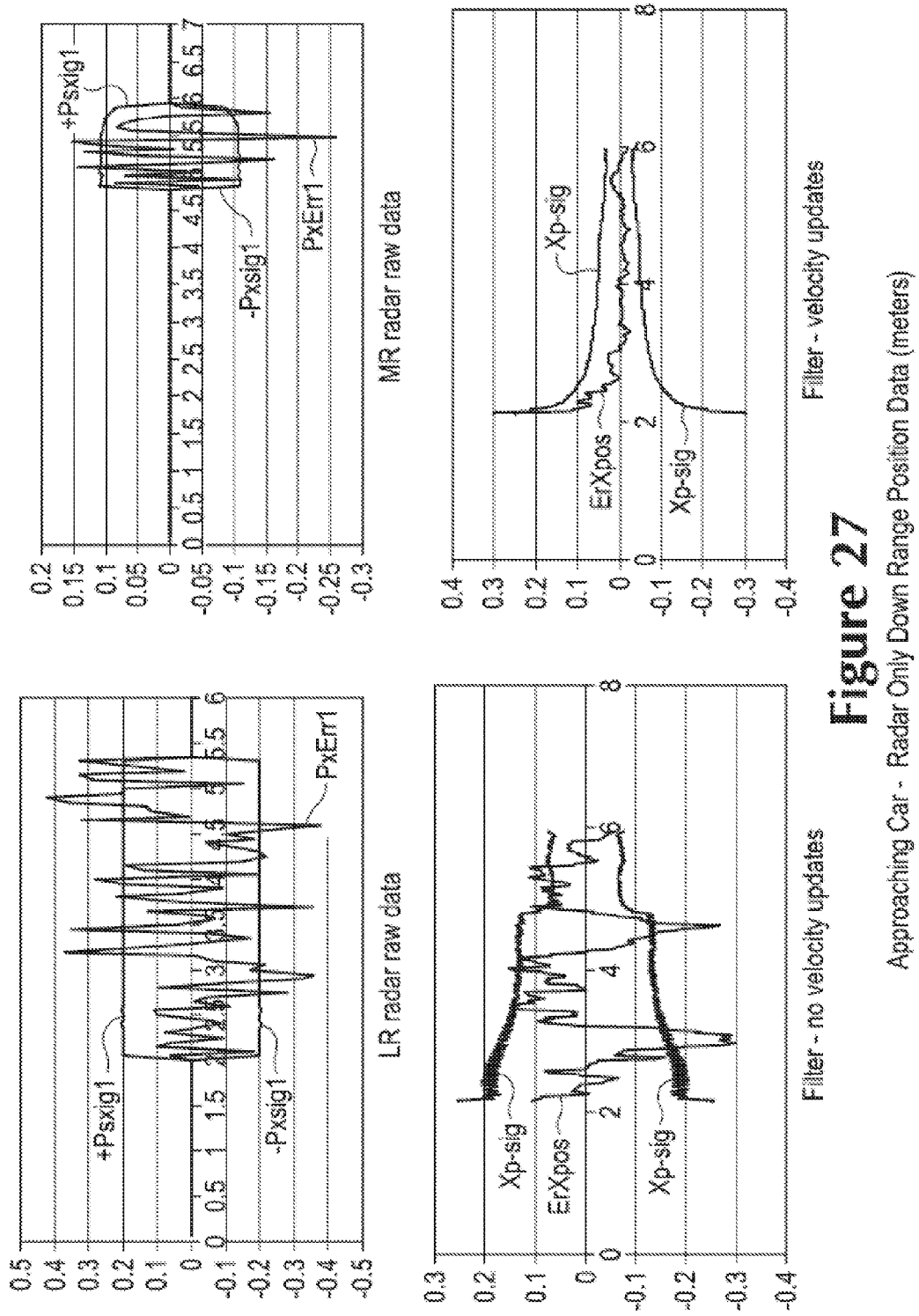

FIG. 27. Using the long range and medium range sensor characteristic data shown in slide 12 raw sensor data is generated. The upper left plot shows the error in the generated down range position for the long range radar and the upper right plots shows the error for the medium range radar. The magenta and yellow lines show the 1-sigma standard deviation values for the noisy data. The maximum range and horizontal FOV determines the start and stop times of the plots.

The bottom plots show the improvement in the position data using the sensor fusion filter. The bottom left plot shows the result of the fusion filter using only position updates. The bottom tight plot uses position and velocity, range-rate, updates. The magenta lines are the true errors since the true track is known. The blue and yellow lines give the filter 1-sigma standard deviation values of the filter error. The decrease in these uncertainty curves for the no velocity update plot is a result of the medium range radar coming into play at about 4.6 seconds. The small bump up after this drop is due to the long range radar dropping out due to FOV. If range-rate updates are available, then the medium range radar does not improve the performance much as shown in the bottom right plot.

Properly tuning the filter should improve the results since the true error points outside the 1-sigma curves are much less than 32%.

Figure 28:
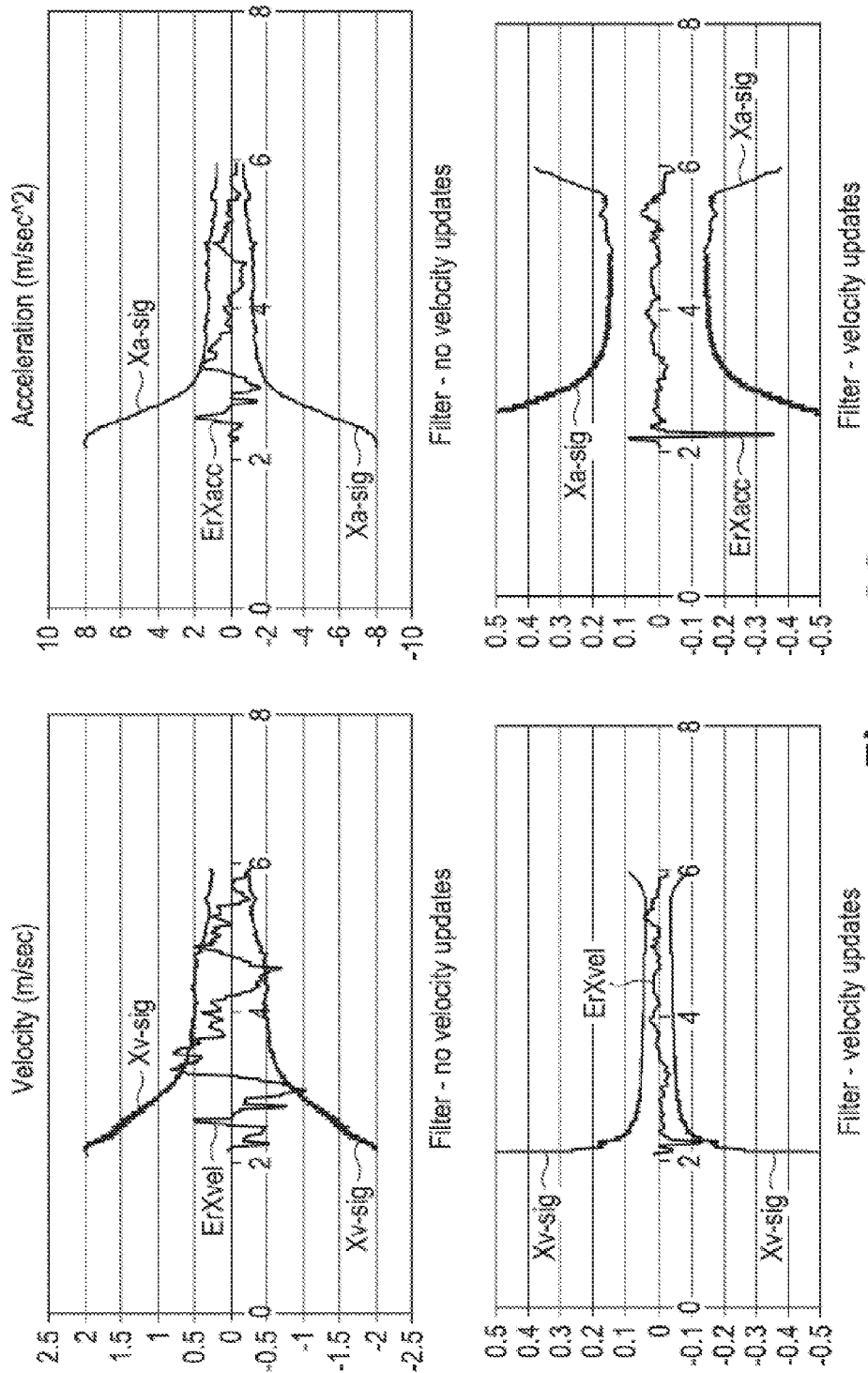

FIG. 28. These plots show the filter down range velocity and acceleration error plots when not using velocity updates and when using velocity updates. Again it shows that the filter is not optimally tuned and with tuning the performance should improve slightly.

The increased values of the uncertainty curves when velocity data is used are a result of the long range radar dropping out due to the target reaching its FOV limits.

Figure 29:
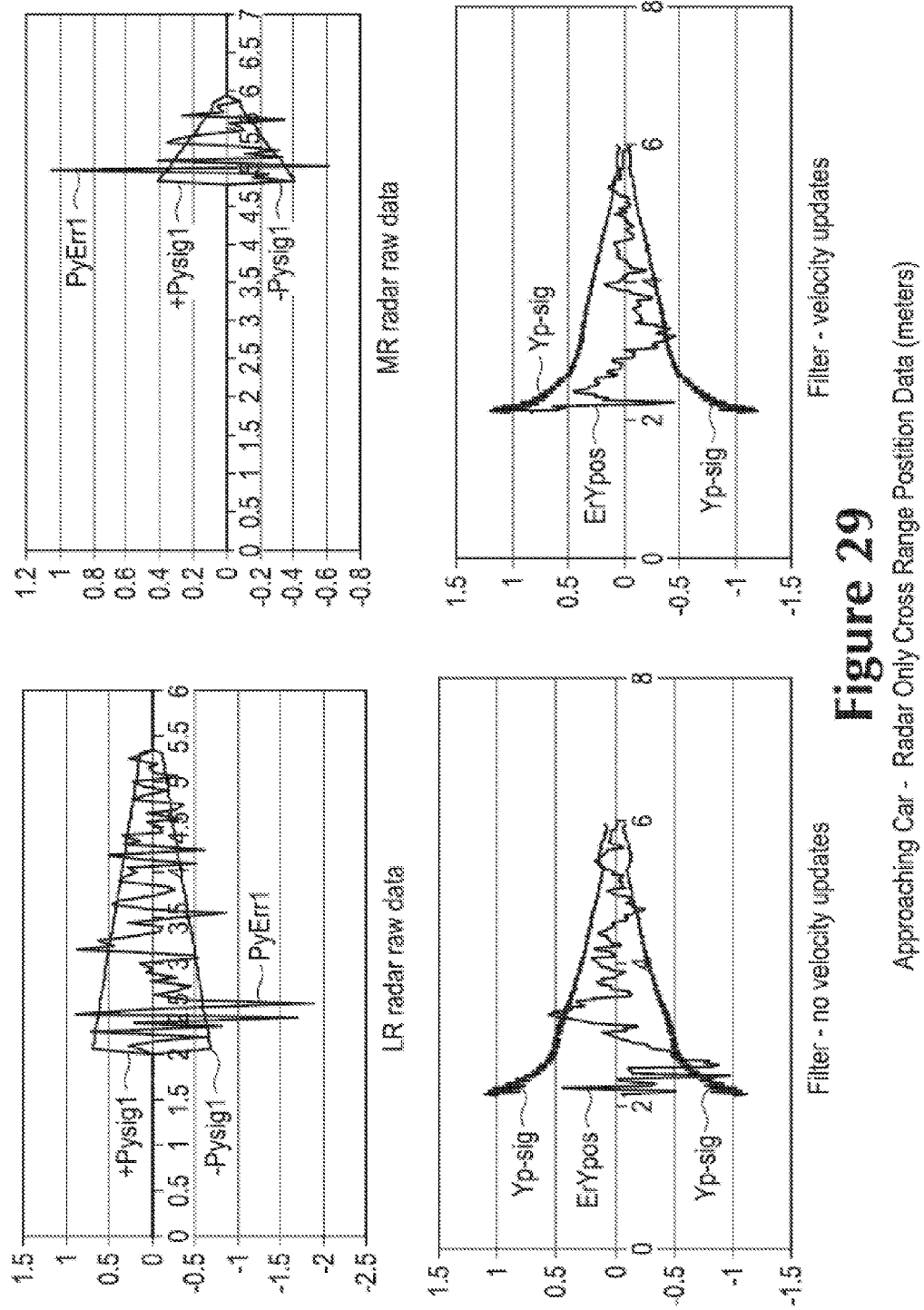

FIG. 29. This shows the same data as slide 17 except this is for the cross range position instead of the down range position. The decrease in the uncertainty curves is a result of the fact that the cross range errors is equal to the range times the angle uncertainty. As the target approaches the host, the range decreases, and therefore, the cross range error decreases.

The small bump up in the filter—no velocity updates uncertainty curves is a result of the long rang radar dropping out due to the FOV restriction.

Figure 30:
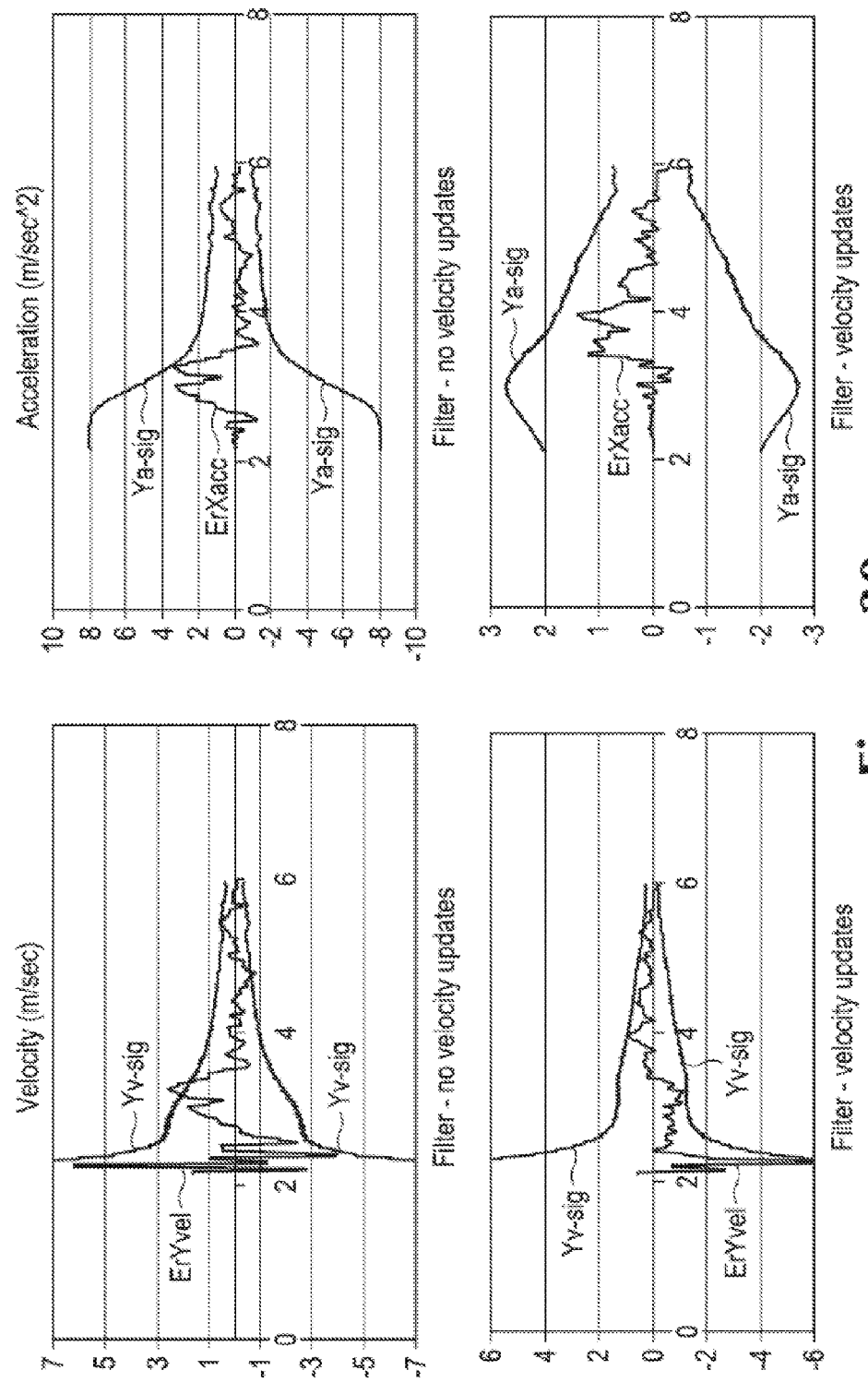
-FIG. 30. Performance Predictions

FIG. 30. This shows the same as slide 18 except for the cross range values instead of the down range values. The bump up in the bottom right plot is because the inventors did not have the initial covariance values large enough for the acceleration.

The systems described above can use dedicated processor systems, micro controllers, programmable logic devices, or microprocessors that perform some or all of the operations. Some of the operations described above may be implemented in software and other operations may be implemented in hardware.

For the sake of convenience, the operations are described as various interconnected functional blocks or distinct software modules. This is not necessary, however, and there may be cases where these functional blocks or modules are equivalently aggregated into a single logic device, program or operation with unclear boundaries. In any event, the functional blocks and software modules or described features can be implemented by themselves, or in combination with other operations in either hardware or software.

Having described and illustrated the principles of the invention in a preferred embodiment thereof, it should be apparent that the invention may be modified in arrangement and detail without departing from such principles. Claim is made to all modifications and variation coming within the spirit and scope of the following claims.

The embodiments of the invention in which an exclusive property or privilege is claimed are defined as follows:

1. A state estimation method for vehicle sensors, comprising:
mounting a plurality of object detection sensors to a platform;
logging into a memory sensor data, wherein the memory comprises any hard disk, Read Only Memory (ROM), Dynamic Random Access (RAM) memory, or any combination of different memory devices;

connecting a controller to the plurality of object detection sensors, wherein the controller comprises at least one of a processor, a micro-controller, and a programmable logic device, and wherein the controller is operatively configured for:

receiving sensor reports from the object detection sensors, determining a first mean value of a first object detection sensor report from a first object detection sensor detecting an object in a first detection, wherein the first mean value is an average value of the central tendency of a one-sigma probability error distribution of the first object detection sensor report in units of cross range and down range values, and wherein the one-sigma probability distribution of the first object detection sensor represents measurement errors and are represented in the same units of cross range and down range as variance of a the detected object, logging into the memory the first mean value and first variance of the first detected object's first detection from the first object detection sensor, wherein the logged first mean value and first variance of the detected object are stored values, determining a second mean value of a second object detection sensor report from a second object detection sensor detecting the object in a second detection, wherein the second mean value is an average value of the central tendency of a one-sigma probability error distribution of the second object detection sensor report in units of cross range and down range values, and wherein the one-sigma probability distribution of the second object detection sensor represents measurement errors and are represented in the same units of cross range and down range as variance of a second detected object, logging into the memory the second mean value and the second variance of the object in the second object detection, wherein the logged second mean value and second variance of the object from the second detection are stored values, a third detection of the object by the first and second sensor, transmitting the measured value of the third detection of the object from the first and second object detection sensors to the controller, responsive to receiving the measured values of the third detection of the object, retrieve from the memory the stored values from the first and second object detection sensors, determining a covariance value of the third detection of the object, using the retrieved stored values, using the measured values of the third detection of the object, and the determined covariance value, use a filter to make a first estimate of state of the third detection of the object, wherein the first estimate of state is the result of combining the first sensor report with the second sensor report, and the first estimate of state includes at least one of position, velocity and acceleration of the third detection of the object, and logging the first estimate of state and determined covariance value into the memory.

2. The method according to claim 1 wherein the object detection sensors include emitting and non-emitting non-contact sensors.

3. The method according to claim 1 wherein the data structure of the object detection sensor reports includes latency of the report.

4. The method of claim 1 wherein the structure of the sensor characterization system is a variable structure using interacting multiple models.

5. The method of claim 1 wherein the object detection sensor report comprises at least one of object kinematics or object attributes of the reported object.

6. The method of claim 1 wherein the sensor characterization system uses one of a track oriented or a measurement oriented data association process.

7. A sensor system, comprising:

a plurality of object detection sensors mounted to a platform;

a memory for logging sensor data, wherein the memory comprises any hard disk, Read Only Memory (ROM), Dynamic Random Access (RAM) memory, or any combination of different memory devices;

a controller connected to the plurality of object detection sensors, wherein the controller comprises at least one of a processor, a micro-controller, and a programmable logic device, and wherein the controller is operatively configured for:

receiving sensor reports from the object detection sensors, determining a first mean value of a first object detection sensor report from a first object detection sensor detecting an object in a first detection, wherein the first mean value is an average value of the central tendency of a one-sigma probability error distribution of the first object detection sensor report in units of cross range and down range values, and wherein the one-sigma probability distribution of the first object detection sensor represents measurement errors and are represented in the same units of cross range and down range as variance of a the detected object, logging into the memory the first mean value and first variance of the detected object's first detection from the first object detection sensor, wherein the logged first mean value and first variance of the detected object are stored values, determining a second mean value of a second object detection sensor report from a second object detection sensor detecting the object in a second detection, wherein the second mean value is an average value of the central tendency of a one-sigma probability error distribution of the second object detection sensor report in units of cross range and down range values, and wherein the one-sigma probability distribution of the second object detection sensor represents measurement errors and are represented in the same units of cross range and down range as variance of a second detected object, logging into the memory the second mean value and the second variance of the object in the second detection, wherein the logged second mean value and second variance of the object from the second detection are stored values, a third detection of the object by the first and second sensor, transmitting the measured value of the third detection of the object from the first and second object detection sensors to the controller, responsive to receiving the measured values of the third detection of the object, retrieve from the memory the stored values from the first and second object detection sensor, determining a covariance value of the third detection of the object, using the retrieved stored values, using the measured values of the third detection of the object, and the determined covariance value, use a filter to make a first estimate of state of the third detection of the object, wherein the first estimate of state is the result of combining the first sensor report with the second sensor report, and the first estimate of state includes at least one of position, velocity and acceleration of the third detection of the object, and logging the first estimate of state and determined covariance value into the memory.

8. The system according to claim 7, wherein the object detection sensors include emitting and non-emitting non-contact sensors.

9. The system according to claim 7, wherein the data structure of the object detection sensor reports includes latency of the report.

10. The system of claim 7, wherein the structure of the sensor characterization system is a variable structure using interacting multiple models.

11. The system of claim 7, wherein the object detection sensor reports comprise at least one of object kinematics or object attributes of the reported object.

12. The system of claim 7, wherein the sensor characterization system uses one of a track oriented or a measurement oriented data association process.

* * * * *